(12) United States Patent
Carlson et al.

(10) Patent No.: US 11,645,897 B2
(45) Date of Patent: *May 9, 2023

(54) SENSOR ASSEMBLY FOR USE IN A SECURITY ALARM SYSTEM AND METHOD OF INSTALLING THE SAME

(71) Applicant: 1010210 B.C. Ltd., Surrey (CA)

(72) Inventors: Julian Paul Carlson, Surrey (CA); Justin Carlson, Surrey (CA); Dean David Schebel, Surrey (CA)

(73) Assignee: 1010210 B.C. Ltd., Surrey (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/544,685

(22) Filed: Dec. 7, 2021

(65) Prior Publication Data

US 2022/0101705 A1 Mar. 31, 2022

Related U.S. Application Data

(63) Continuation of application No. 16/938,962, filed on Jul. 25, 2020, now Pat. No. 11,341,829, which is a
(Continued)

(51) Int. Cl.
*G08B 13/24* (2006.01)
*G01V 3/08* (2006.01)
(Continued)

(52) U.S. Cl.
CPC ..... *G08B 13/2491* (2013.01); *G01R 33/0023* (2013.01); *G01R 33/02* (2013.01);
(Continued)

(58) Field of Classification Search
CPC ... G08B 3/10; G08B 5/36; G08B 6/00; G08B 13/06; G08B 13/08; G08B 13/24;
(Continued)

(56) References Cited

U.S. PATENT DOCUMENTS 3,986,183 A 10/1976 Fujiwara
4,296,410 A 10/1981 Higgs et al.
(Continued)

FOREIGN PATENT DOCUMENTS

CA 3100201 A1 11/2019
CN 201780643 U 3/2011
(Continued)

OTHER PUBLICATIONS

Vision Security: "Installation & Operation Manual ZD 2012", published Feb. 10, 2011.
(Continued)

*Primary Examiner* — Steven L Yeninas
(74) *Attorney, Agent, or Firm* — Oyen Wiggs Green & Mutala LLP; Nicholas Garner

(57) ABSTRACT

There is provided a method of installing a magnetic proximity sensor including positioning the magnetic field sensor in a desired location and positioning a magnet in a desired location relative to the magnetic field sensor, with an indicator of the sensor continuing to be turned on during the predetermined period of time when the magnetic field generated by the magnet is sensed by the magnetic field sensor, and being turned off during the predetermined period of time when the magnetic field generated by the magnet is not sensed by the magnetic field sensor. The indicator light thus assists in determining proper relative positioning of the magnet and the magnetic field sensor. If after the predetermined period of time more time is needed to install the magnetic proximity sensor, the method includes initiates another predetermined period of time by removing and replacing a lid of the magnetic proximity sensor.

20 Claims, 37 Drawing Sheets

Related U.S. Application Data continuation-in-part of application No. 15/906,527, filed on Feb. 27, 2018, now abandoned, which is a continuation of application No. 15/329,233, filed as application No. PCT/CA2015/050711 on Jul. 27, 2015, now Pat. No. 9,905,099, which is a continuation of application No. 14/341,710, filed on Jul. 25, 2014, now Pat. No. 10,249,161, which is a continuation-in-part of application No. 14/341,710, filed on Jul. 25, 2014, now Pat. No. 10,249,161.

(60) Provisional application No. 62/140,439, filed on Mar. 30, 2015.

(51) Int. Cl.
| | | |
|---|---|---|
| *G08B 3/10* | (2006.01) | |
| *G08B 6/00* | (2006.01) | |
| *G01R 33/02* | (2006.01) | |
| *G08B 5/36* | (2006.01) | |
| *G08B 13/08* | (2006.01) | |
| *G01R 33/00* | (2006.01) | |
| *G08B 25/10* | (2006.01) | |

(52) U.S. Cl.
CPC ............... *G01V 3/081* (2013.01); *G08B 3/10* (2013.01); *G08B 5/36* (2013.01); *G08B 6/00* (2013.01); *G08B 13/08* (2013.01); *G08B 13/24* (2013.01); *G08B 25/10* (2013.01)

(58) Field of Classification Search
CPC .. G08B 13/2491; G08B 25/10; G08B 29/046; G08B 29/185
See application file for complete search history.

(56) References Cited

U.S. PATENT DOCUMENTS

| | | | |
|---|---|---|---|
| 4,954,812 | A | 9/1990 | Lebron |
| 5,164,705 | A | 11/1992 | Dunagan et al. |
| 5,434,500 | A | 7/1995 | Hauck et al. |
| 5,714,932 | A | 2/1998 | Castellon et al. |
| 6,400,267 | B1 | 6/2002 | Gordon-Levitt et al. |
| 6,577,238 | B1 | 6/2003 | Whitesmith et al. |
| 7,079,034 | B2 | 7/2006 | Stilp |
| 7,221,230 | B2 | 5/2007 | Partridge et al. |
| 8,410,937 | B2 | 4/2013 | Collins |
| 8,773,263 | B2 | 7/2014 | Thibault |
| 8,933,789 | B1 | 1/2015 | Fink et al. |
| 9,659,470 | B2 | 5/2017 | Smith |
| 9,695,015 | B1 | 7/2017 | Marinelli |
| 9,767,660 | B1 | 9/2017 | Skarda |
| 9,905,099 | B2 | 2/2018 | Carlson et al. |
| 10,249,161 | B2 | 4/2019 | Carlson |
| 2001/0030605 | A1 | 10/2001 | Novotny |
| 2005/0024207 | A1 | 2/2005 | Schebel et al. |
| 2005/0096587 | A1 | 5/2005 | Santini, Jr. et al. |
| 2005/0179545 | A1 | 8/2005 | Bergman et al. |
| 2007/0279226 | A1 | 12/2007 | Whitesmith et al. |
| 2008/0290864 | A1* | 11/2008 | Latraverse ............ G01V 3/081 324/229 |
| 2009/0201209 | A1 | 8/2009 | Boyle |
| 2010/0102907 | A1 | 4/2010 | Schebel et al. |
| 2011/0004916 | A1 | 1/2011 | Schiffman et al. |
| 2011/0156905 | A1 | 6/2011 | Collins |
| 2012/0089299 | A1 | 4/2012 | Breed |
| 2013/0057404 | A1 | 3/2013 | Thibault |
| 2013/0057405 | A1 | 3/2013 | Seelman et al. |
| 2013/0170532 | A1 | 7/2013 | Marozsak et al. |
| 2013/0257611 | A1 | 10/2013 | Lamb et al. |
| 2013/0316583 | A1 | 11/2013 | Scherer et al. |
| 2014/0340222 | A1 | 11/2014 | Thornton et al. |
| 2015/0199888 | A1 | 7/2015 | Shapira et al. |
| 2015/0348385 | A1 | 12/2015 | Lamb et al. |
| 2018/0365943 | A1* | 12/2018 | DiPoala ................ G08B 13/08 |
| 2021/0272431 | A1* | 9/2021 | Chavady ............... H04W 76/25 |
| 2021/0327230 | A1* | 10/2021 | Wang ................... G08B 13/149 |

FOREIGN PATENT DOCUMENTS

| | | |
|---|---|---|
| DE | 20017433 U1 | 3/2001 |
| DE | 202014000574 U1 | 2/2014 |
| DE | 102013217366 A1 | 11/2014 |
| EP | 1860624 A1 | 11/2007 |
| GB | 2356077 A | 5/2001 |
| GB | 2461815 A | 1/2010 |
| NL | 1000644 C2 | 12/1996 |
| WO | 2003046855 A1 | 6/2003 |
| WO | 2016011564 A1 | 1/2016 |

OTHER PUBLICATIONS

WIPO, International Searching Authority, International Search Report dated Nov. 5, 2015 in International Patent Application No. PCT/CA2015/050711.

European Search Report completed Feb. 1, 2018 for EP 15 82 4924.

WIPO, International Searching Authority, International Search Report dated Jul. 23, 2019 in International Patent Application No. PCT/CA2019/000071.

Extended Supplementary European Search Report dated May 14, 2021 for European Patent Application No. EP 19 80 3339.

WIPO, International Searching Authority, International Search Report dated Aug. 9, 2021 in International Patent Application No. PCT/CA2020/051582.

\* cited by examiner

SENSOR ASSEMBLY FOR USE IN A SECURITY ALARM SYSTEM AND METHOD OF INSTALLING THE SAME

BACKGROUND OF THE INVENTION

Field of the Invention

The present invention relates to a sensor assembly and, in particular, to a magnetic field sensor with an indicator which indicates the presence or absence of a magnetic field or, to a security alarm sensor with an RFID reader which indicates when the sensor is within a predetermined distance of an RFID tag.

Description of the Related Art

It is known to provide a magnetic field sensor with a light-emitting diode indicator. U.S. Pat. No. 4,296,410, which issued on Oct. 20, 1981 to Higgs et al., discloses an integrated circuit including a Hall element and a threshold detector. The threshold detector is encased in a plastic housing with the plane of the Hall element parallel with a face of the housing to provide a two-state Hall element proximity sensor. A light-emitting diode is mounted in the housing and is connected to the output of the detector. This provides visual indication of the state of the sensor. A kit includes the sensor and a compatible magnet which may be used as a proximity sensor in a security alarm system,

SUMMARY OF THE INVENTION

It is an object of the present invention to provide a magnetic field sensor having an indicator which indicates the presence or absence of a magnetic field, or a security alarm sensor with an RFID reader which indicates when the sensor in communication range with an RFID tag.

There is accordingly provided a magnetic field sensor comprising a microprocessor and an indicator which turns on when a magnetic field is sensed and turns off when a magnetic field is not sensed. The microprocessor renders the indicator inoperable a predetermined period of time after the magnetic field sensor is powered up.

There is also provided a magnetic proximity sensor including a magnet which generates a magnetic field and a magnetic field sensor. The magnetic field sensor comprises a microprocessor and an indicator which turns on when a magnetic field generated by the magnet is sensed and turns off when a magnetic field generated by the magnet is not sensed. The microprocessor renders the indicator inoperable a predetermined period of time after the magnetic field sensor is powered up.

There is further provided a magnetic field sensor comprising a housing having a lid. The magnetic field sensor includes a tamper switch which detects when the lid of the housing is opened. The magnetic field sensor includes a device which senses a presence or an absence of a magnetic field. The magnetic field sensor includes a power source disposed within the housing. The magnetic field sensor includes a pull strip positioned to inhibit the power source from providing power to the magnetic field sensor. The magnetic field sensor is powered up when the pull strip is removed from the power source. The magnetic field sensor includes a microprocessor. A signal is sent by the tamper switch to the microprocessor when the lid of the housing is open. A signal is sent by the device to the microprocessor when a magnetic field is sensed. The magnetic field sensor includes an indicator which indicates the presence or the absence of a magnetic field. The power source supplies current to the indicator, and the indicator turns on when a magnetic field is sensed and turns off when a magnetic field is not sensed. The indicator is initially operable following the pull strip being removed from the power source and the magnetic field sensor being powered up. The microprocessor renders the indicator inoperable a predetermined period of time after the pull strip is removed from the power source and the magnetic field sensor is powered up. The indicator remains inoperable until the lid of the housing is removed and the lid of the housing is closed at which point the indicator is operable until the microprocessor renders the indicator inoperable a predetermined period of time after the lid of the housing is closed.

There is yet also provided a proximity sensor including a magnet which generates a magnetic field and a magnetic field sensor. The magnetic field sensor includes a housing having a lid. The magnetic field sensor includes a tamper switch which detects when the lid of the housing is opened. The magnetic field sensor includes a device which senses a presence or an absence of a magnetic field. The magnetic field sensor includes a power source disposed within the housing. The magnetic field sensor includes a pull strip positioned to inhibit the power source from providing power to the magnetic field sensor. The magnetic field sensor is powered up when the pull strip is removed from the power source. The magnetic field sensor includes a microprocessor. A signal is sent by the tamper switch to the microprocessor when the lid of the housing is open. A signal is sent by the device to the microprocessor when a magnetic field is sensed. The magnetic field sensor includes an indicator which indicates the presence or the absence of a magnetic field. The power source supplies current to the indicator, and the indicator turns on when a magnetic field is sensed and turns off when a magnetic field is not sensed. The indicator is initially operable following the pull strip being removed from the power source and the magnetic field sensor being powered up. The microprocessor renders the indicator inoperable a predetermined period of time after the pull strip is removed from the power source and the magnetic field sensor is powered up. The indicator remains inoperable until the lid of the housing is removed and the lid of the housing is closed at which point the indicator is operable until the microprocessor renders the indicator inoperable a predetermined period of time after the lid of the housing is closed.

There is yet further provided a method of installing a magnetic proximity sensor. The magnetic proximity sensor includes a magnet. The method includes providing the magnetic proximity sensor with an indicator that turns on for a predetermined period of time when a magnetic field generated by the magnet is sensed by the magnetic field sensor. The method includes positioning the magnetic field sensor in a desired location and positioning the magnet in a desired location relative to the magnetic field sensor. The indicator continues to be turned on during said predetermined period of time when the magnetic field generated by the magnet is sensed by the magnetic field sensor. The indicator is turned off during the predetermined period of time when the magnetic field generated by the magnet is not sensed by the magnetic field sensor. The indicator light thus assists in determining proper relative positioning of the magnet and the magnetic field sensor. If after the predetermined period of time more time is needed to install the magnetic proximity sensor, the method includes initiating another predetermined period of time by removing and replacing a lid of the magnetic proximity sensor.

In one example, the indicator may be a light-emitting diode. The power source may be a coin cell battery. The magnetic field sensor may include a supercapacitor. The magnetic field sensor may also include a tamper switch.

The sensors disclosed herein may be used together with a magnet as a proximity sensor, for example, as a door sensor or window sensor in a security alarm system.

There is yet additionally provided a security alarm sensor assembly comprising an RFID tag mountable on a first of a window or a door or framing thereof. The security alarm sensor assembly includes a sensor mountable on a second of the window or the door or said framing thereof. The sensor includes a housing having a lid. The sensor includes a tamper switch which detects when the lid of the housing is opened. The sensor includes a power source disposed within the housing. The sensor includes an RFID reader which emits an electromagnetic field. The sensor includes a microprocessor. A signal is sent by the tamper switch to the microprocessor when the lid of the housing is open. The microprocessor analyzes changes in signals from the RFID tag to determine when a distance between the RFID tag and the RFID reader is within a predetermined threshold. The sensor includes an indicator which indicates when the distance between the RFID tag and the RFID reader is within said predetermined threshold. The power source supplies current to the indicator. The indicator turns on when the distance between the RFID tag and the RFID reader is within said predetermined threshold. The indicator turns off when the distance between the RFID tag and the RFID reader is outside of said predetermined threshold. The indicator is initially operable upon the sensor being powered up. The microprocessor renders the indicator inoperable a predetermined period of time after the sensor being powered up. The indicator remains inoperable until the lid of the housing is removed and the lid of the housing is next closed at which point the indicator is operable until the microprocessor renders the indicator inoperable a predetermined period of time after the lid of the housing is closed.

BRIEF DESCRIPTIONS OF DRAWINGS

The invention will be more readily understood from the following description of the embodiments thereof given, by way of example only, with reference to the accompanying drawings, in which.

Figure 29:
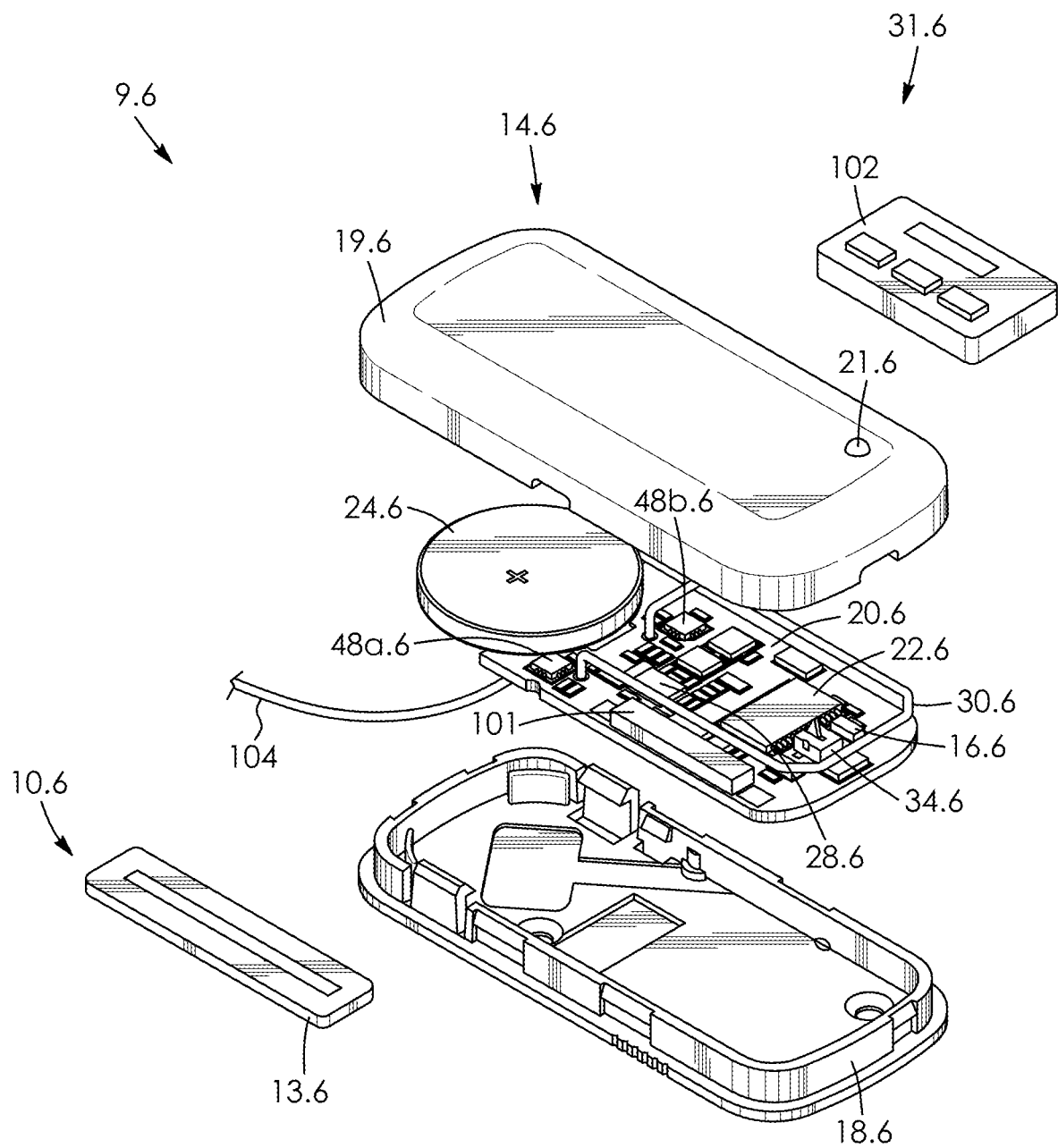
FIG. 29 is a perspective view of a sensor assembly according to a seventh aspect, the sensor assembly comprising an RFID tag and a sensor with an RFID reader, the sensor being shown in a perspective, exploded view.
Figure 30:
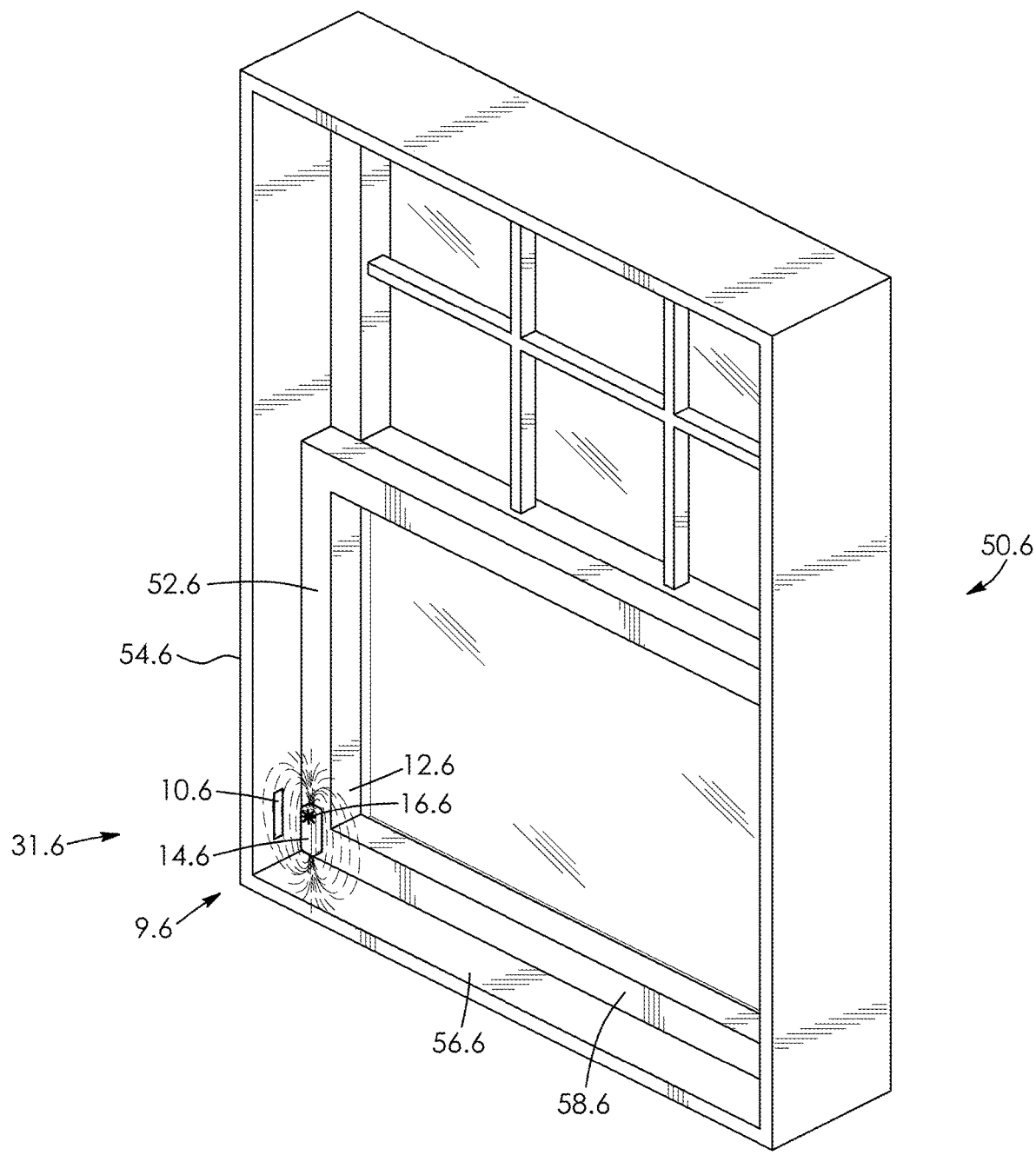
FIG. 30 is a perspective view showing the RFID tag and the sensor of FIG. 29 being used as a window sensor in a security alarm system with the window closed.
Figure 32:
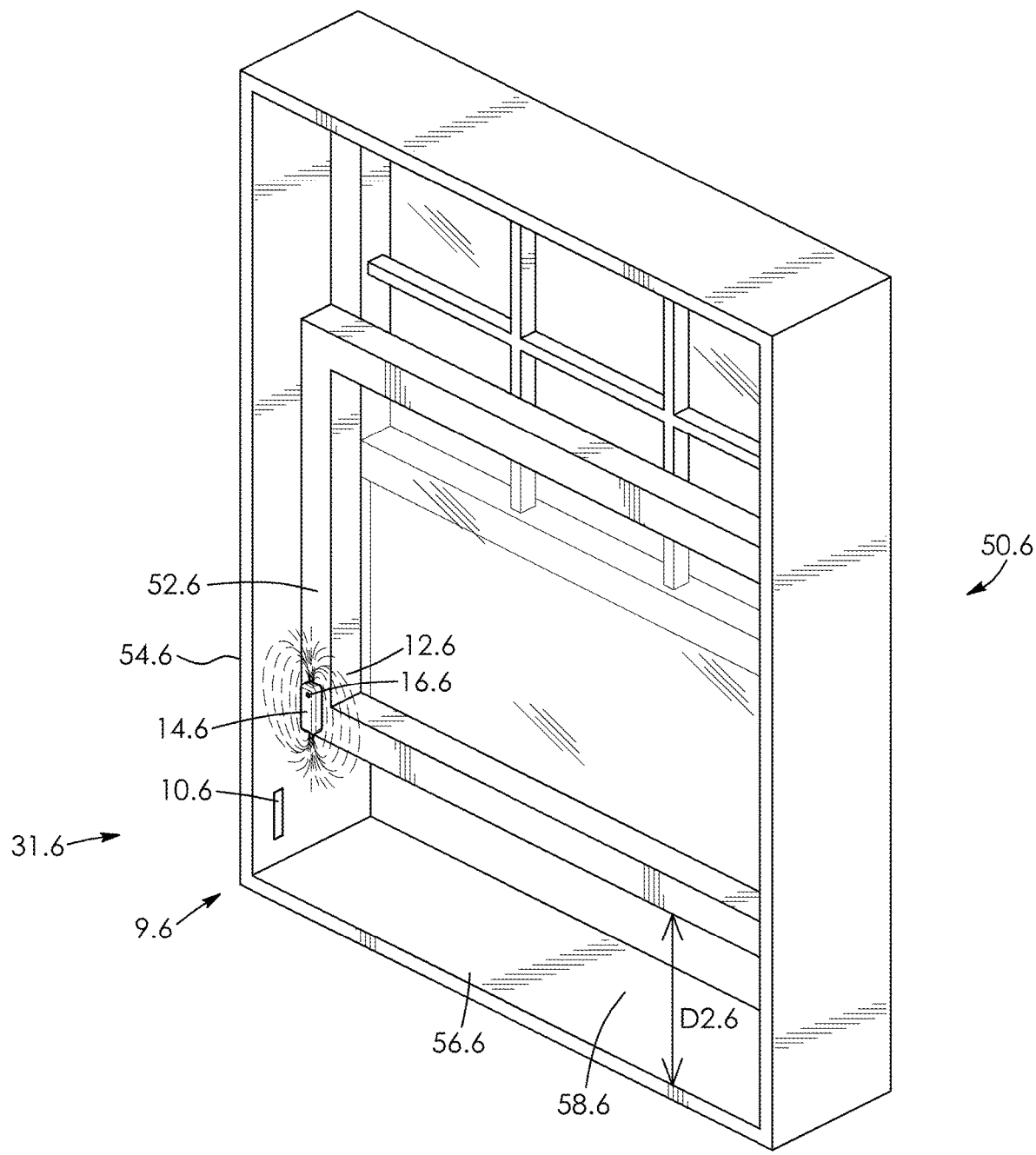
Figure 33:
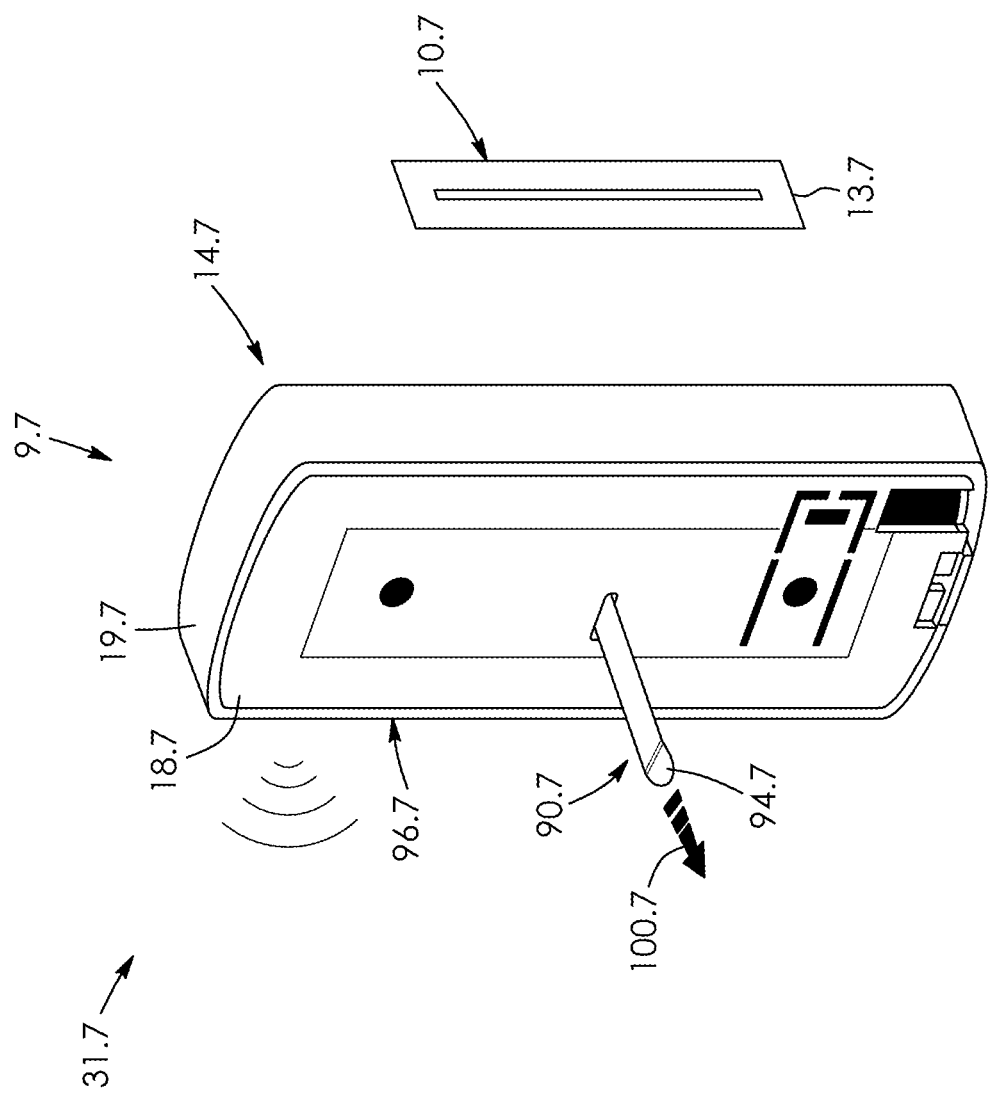

FIG. 32 is a perspective view showing the RFID tag, the sensor and the window of FIG. 30, the window being open a distance of D2.6; and FIG. 33 is a rear, left side perspective view of a sensor assembly according to an eighth aspect, the sensor assembly being similar to that shown in FIG. 29 with the exception that the sensor assembly includes a pull strip with the removal thereof enabling a power source thereof to power the sensor thereof.

DESCRIPTIONS OF THE PREFERRED EMBODIMENTS

Figure 1:
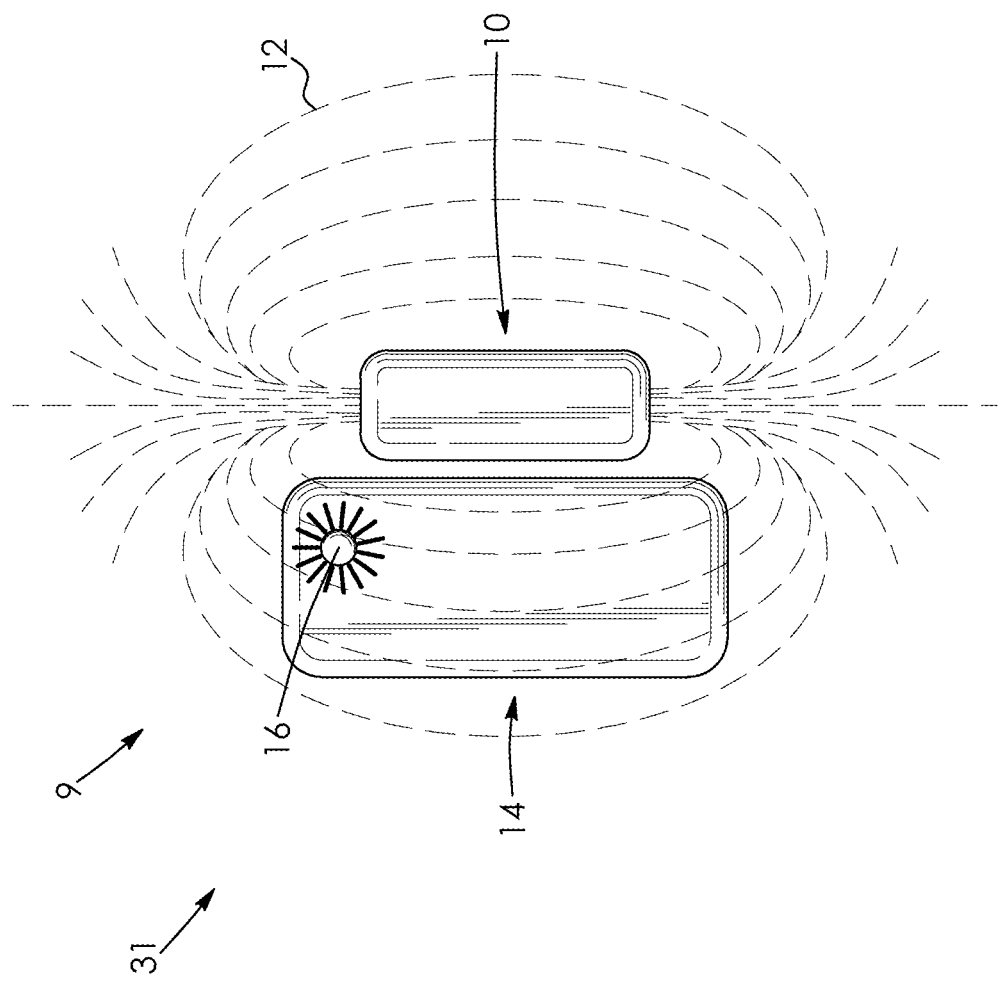
FIG. 1 is a perspective view of a sensor assembly according to a first aspect, the sensor assembly comprising a magnet and a first magnetic field sensor.
Figure 2:
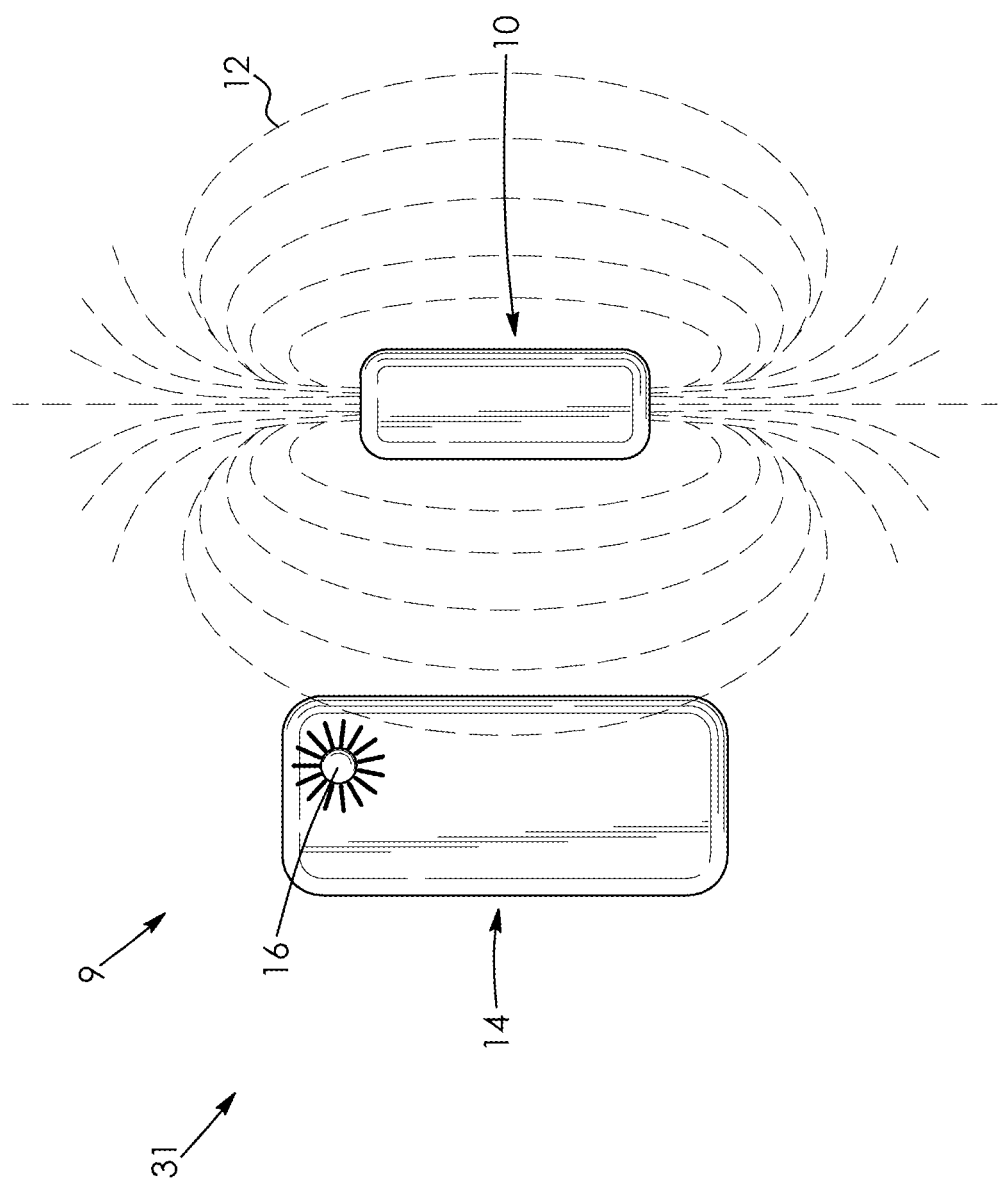
FIG. 2 is another perspective view of the magnet and the magnetic field sensor of FIG. 1.
Figure 3:
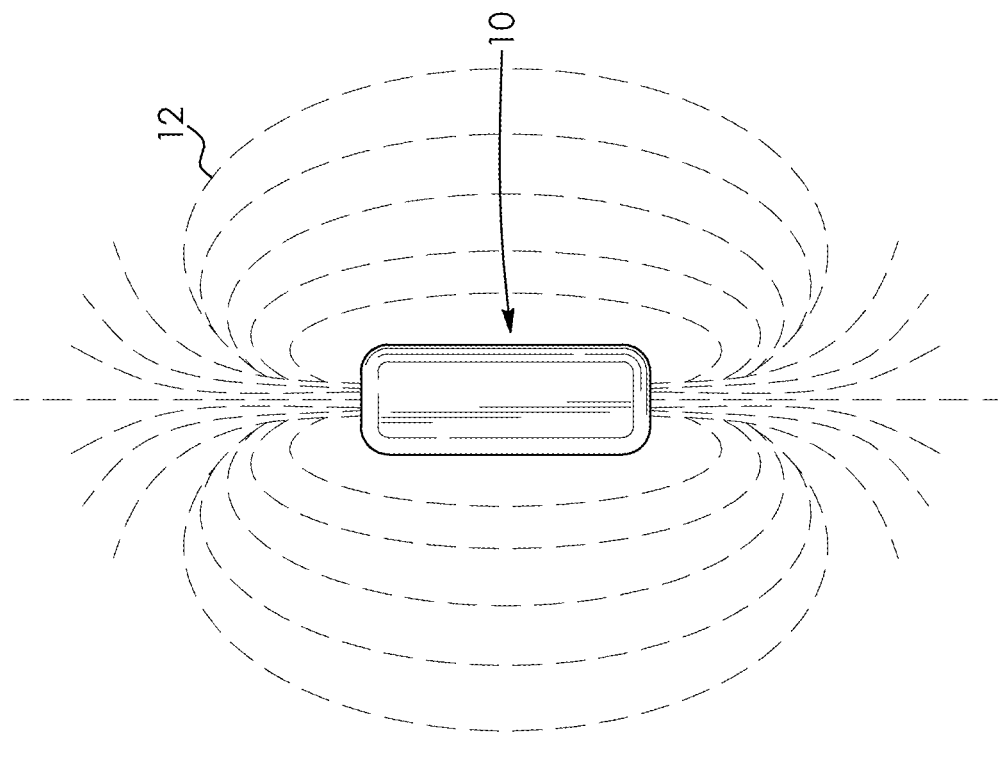
FIG. 3 is a further perspective view of the magnet and the magnetic field sensor of FIG. 1.
Figure 3:
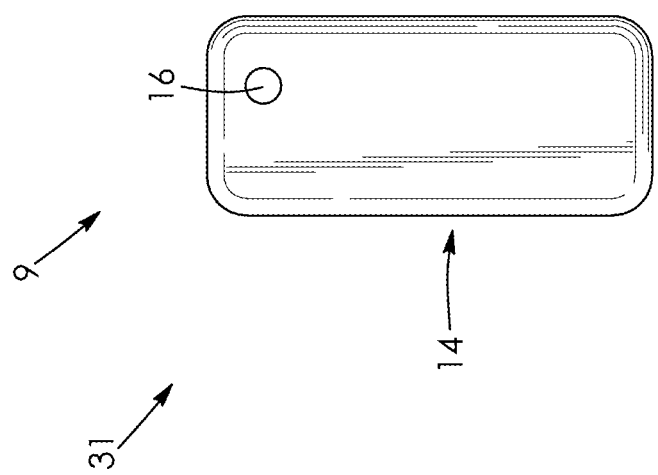

Referring to the drawings and first to FIGS. 1 to 3, there is a provided a sensor assembly 9. The sensor assembly includes a first subassembly, in this embodiment in the form of a magnet 10. The sensor assembly 9 includes a second subassembly, in this embodiment a sensor, in this example a magnetic field sensor 14. A field, in this example a magnetic field 12, is generated by the magnet 10 and said magnetic field is sensed by the magnetic field sensor.

The magnetic field sensor 14 includes an indicator which, in this example, is a visual indicator in the form of an indicator light 16 that turns on when the magnetic field sensor 14 is within the magnetic field 12 as shown in FIGS. 1 and 2. The indicator light 16 turns off when the magnetic field sensor 14 is outside the magnetic field 12 as shown in FIG. 3. The indicator light 16 may accordingly provide a visual indication as to the presence or absence of a magnetic field. Together with magnet 10 and magnetic field sensor 14 may be used as a magnetic proximity sensor.

Figure 4:
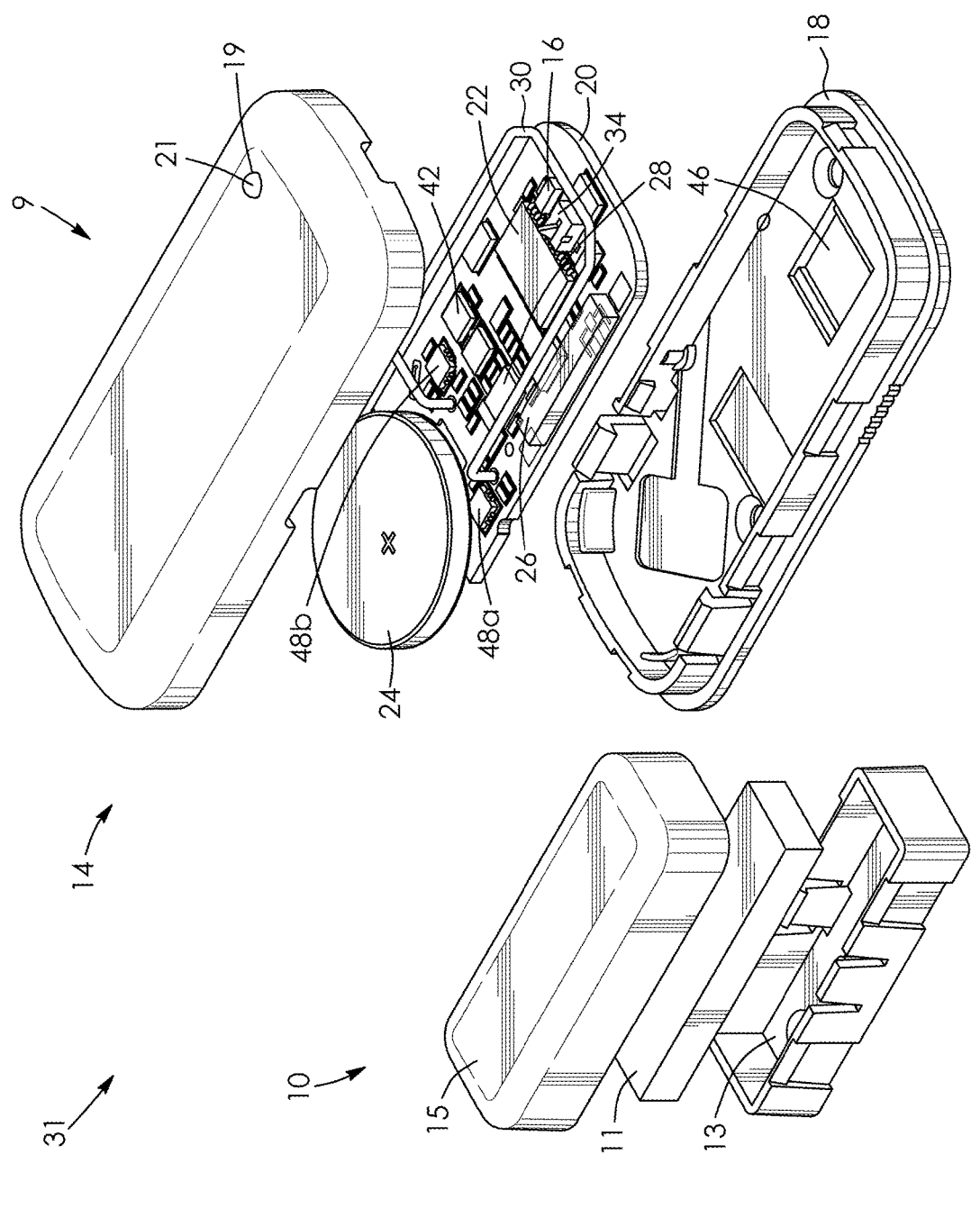
FIG. 4 is an exploded view of the magnet and the magnetic field sensor of FIG. 1.

The magnet 10 is shown in greater detail in FIG. 4 and, in this example, is a bar magnet 11 which is disposed in a housing 13 provided with a cover 15. The magnetic field sensor 14 is also shown in greater detail in FIG. 4 and, in this example, is a substantially rectangular parallelepiped with rounded corners but may be other shapes. The magnetic field sensor 14 includes a housing 18 and a circuit board 20 disposed within the housing. The housing 18 is provided with a lid 19 that has a window 21 to facilitate viewing of the indicator light 16 which is mounted on the circuit board 20. The window 21 may be an aperture in the lid 19 or a translucent portion of the lid 19. A microprocessor 22, a power source which is in the form of a coin cell battery 24, and a device which senses a magnetic field which is in the form of a reed switch 26 are also mounted on the circuit board 20. It will however be understood by a person skilled in the art that any AC or DC power source may be used. Likewise any device which senses a magnetic field, such as a magnetoresistive sensor or Hall Effect sensor or MAGNASPHERE™ may be used in place of the reed switch.

In this example, the indicator light 16 is a light-emitting diode package and includes a blue light-emitting diode, a green light-emitting diode, and a red light-emitting diode. The reed switch 26 is actuated by a magnetic field and the microprocessor 22 monitors the change of state of the reed switch 26 by periodically sampling the reed switch 26 to sense a magnetic field. If a magnetic field is sensed then the microprocessor 22 turns on the indicator light 16. In the absence of a magnetic field, the microprocessor 22 turns the indicator light 16 off. The sampling of the reed switch 26 by the microprocessor 22 may be done, for example, four times per second or as many times per second as required. The sensitivity of the magnetic field sensor 14 may be adjusted by selecting different types of reed switches. This may be used to set a maximum or minimum distance at which the magnetic field sensor 14 is able to sense a magnet. If another device which senses a magnetic field is used in the magnetic sensor, such as a magnetoresistive sensor or Hall Effect sensor or MAGNASPHERE™, then the sensitivity of the magnetic field sensor may be adjusted based on measured analog and/or digital output.

Figure 5:
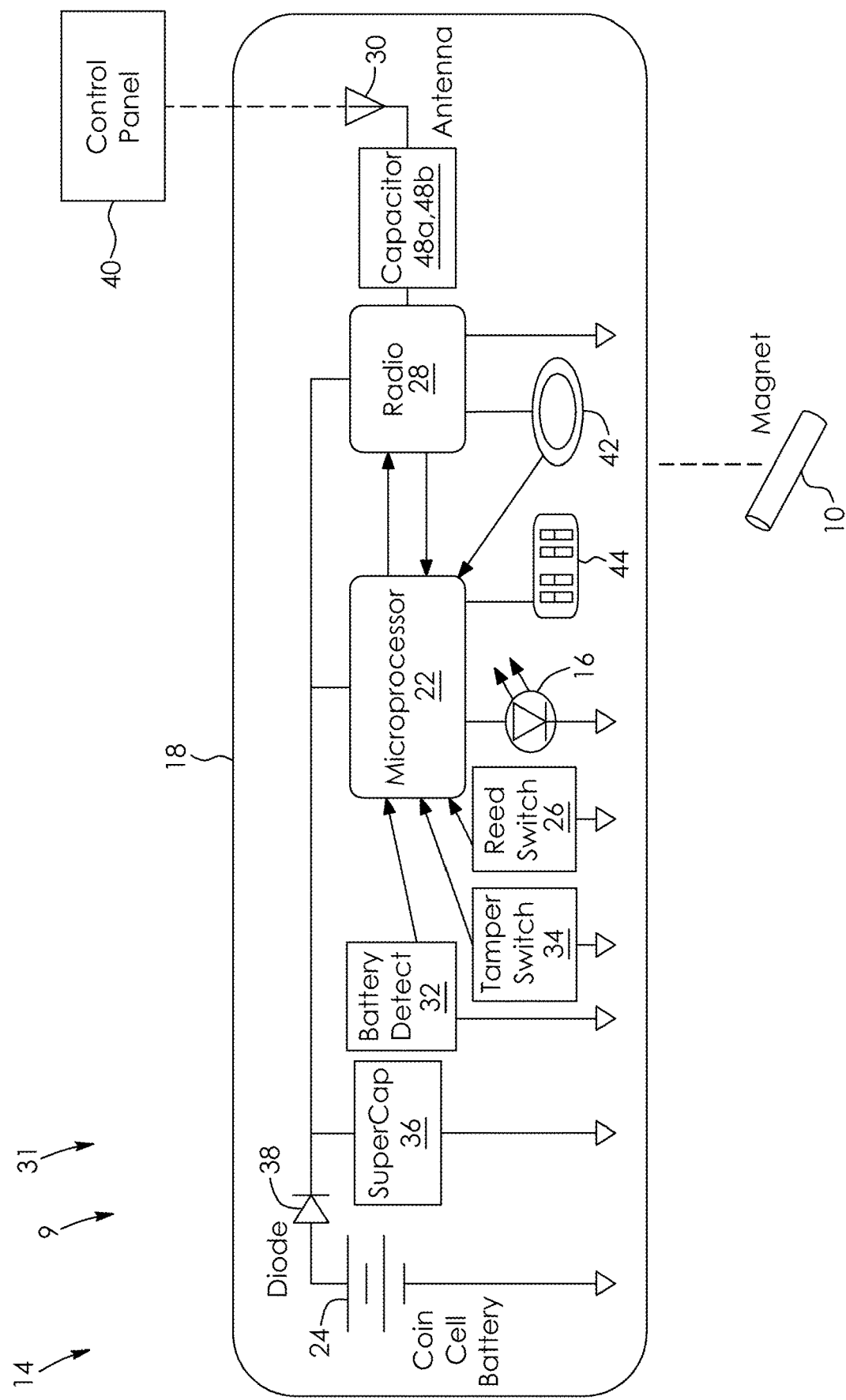
FIG. 5 is a schematic diagram of the magnetic field sensor of FIG. 1.

Referring now to FIG. 5, in this example, the magnetic field sensor 14 includes a radio, which is in the form of a radio chip 28 in this example, and an antenna 30 that allows the magnetic field sensor 14 to transmit and receive radio signals. The antenna 30 may communicate with a control panel 40 as part of a security alarm system 31. There is also a battery detection circuit 32, a tamper switch 34, and a supercapacitor 36. The battery detection circuit 32 and tamper switch 34 are both conventional and in communication with the microprocessor 22. The supercapacitor 36 may be used to assist the coin cell battery 24 as the power source. Without the supercapacitor 36 the coin cell battery 24 may not be able to provide the surge current required when the radio chip 28 and the antenna 30 transmit and receive radio signals. This is due to the internal resistance of a coin cell battery. A coin cell battery generally cannot be used in applications requiring current in excess of about 20 to 30 milliamperes. The internal resistance of the coin cell battery causes a voltage drop when larger currents are required. This may cause the terminal voltage to drop below a minimum acceptable level of, for example, 2.2 volts.

The supercapacitor 36 may have a low profile which, in combination with use of the coin cell battery 24, allows the magnetic field sensor 14 to be relatively small. The supercapacitor 36 allows for high short term current draws while still providing a terminal voltage of, for example, 3.0 volts. Without the supercapacitor 36 a larger battery may have to be used as a power source. The supercapacitor 36 may have a sufficient residual charge to prevent the microprocessor 22 from properly detecting the removal of the coin cell battery 24 during battery replacement. However, the battery detection circuit 32 allows the microprocessor 22 to shut down properly when the coin cell battery 24 is removed. There may also be a reverse voltage protection circuit 38, which may be a diode or P-channel mosfet, connected in series between the coin cell battery 24 and the supercapacitor 36 to ensure that the coin cell battery 24 is not reverse charged if the supercapacitor 36 has a higher voltage. The tamper switch 34 may be internal or external of the housing 18 and detects when the lid 19 of the housing 18 is removed and sends a signal to the microprocessor that the lid 19 of the housing 18 has been removed and someone is tampering with the magnetic field sensor 14. The tamper switch 34 also sends a signal to the microprocessor 22 to restart an algorithm related to the sensing of a magnetic field when the tamper switch 34 detects that the lid 19 of the housing 18 has been removed. In other examples, the magnetic field sensor may not have a tamper switch and the microprocessor may be signalled to restart the algorithm related to the sensing of a magnetic field when the coin cell battery is inserted. The microprocessor may alternatively be signalled to restart the algorithm related to the sensing of a magnetic field when an ON/OFF switch is actuated. Such an ON/OFF switch may be used turn the indicator on and off.

Figure 6:
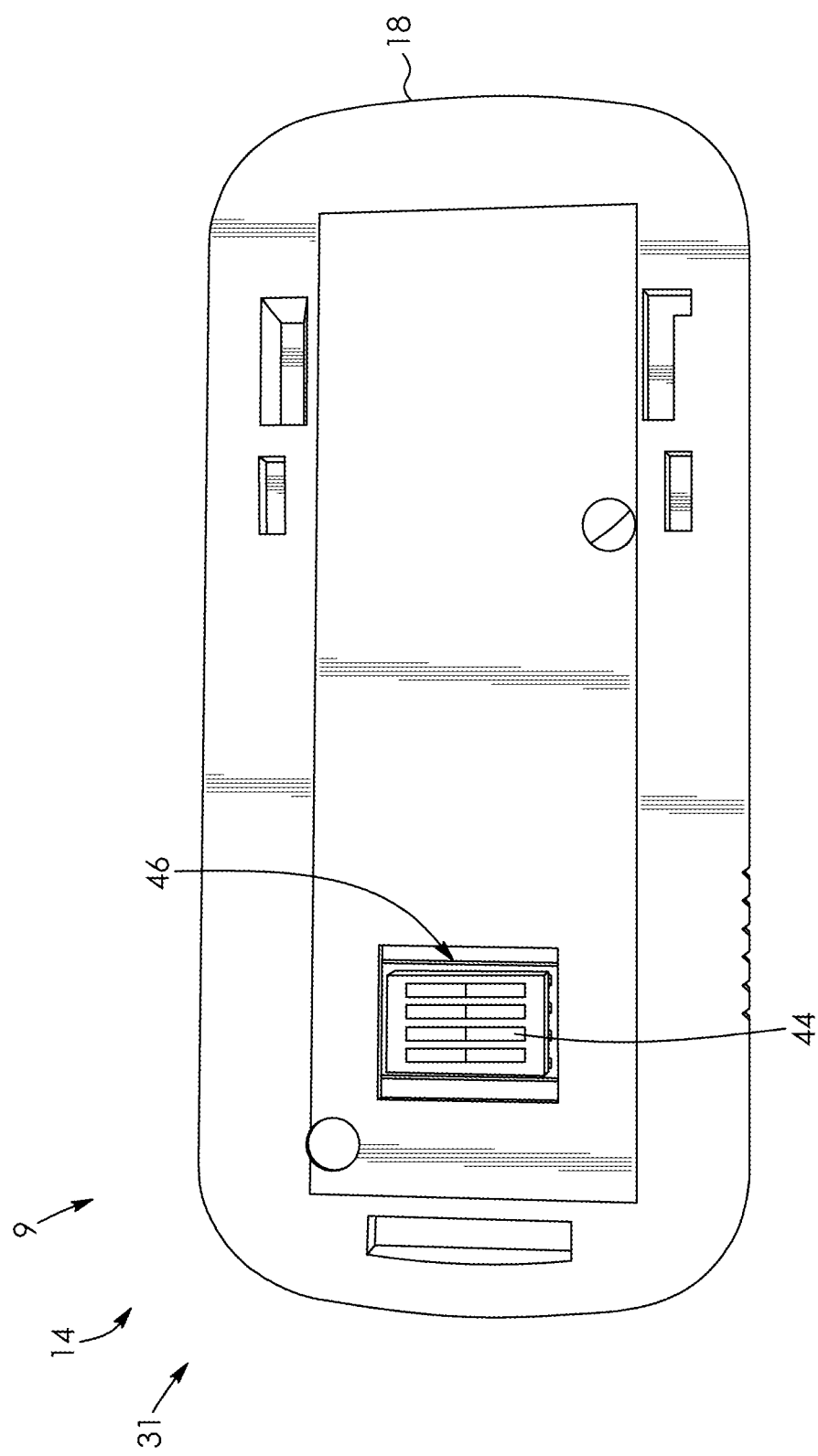
FIG. 6 is a bottom plan view of the magnetic field sensor of FIG. 1.
Figure 7A:
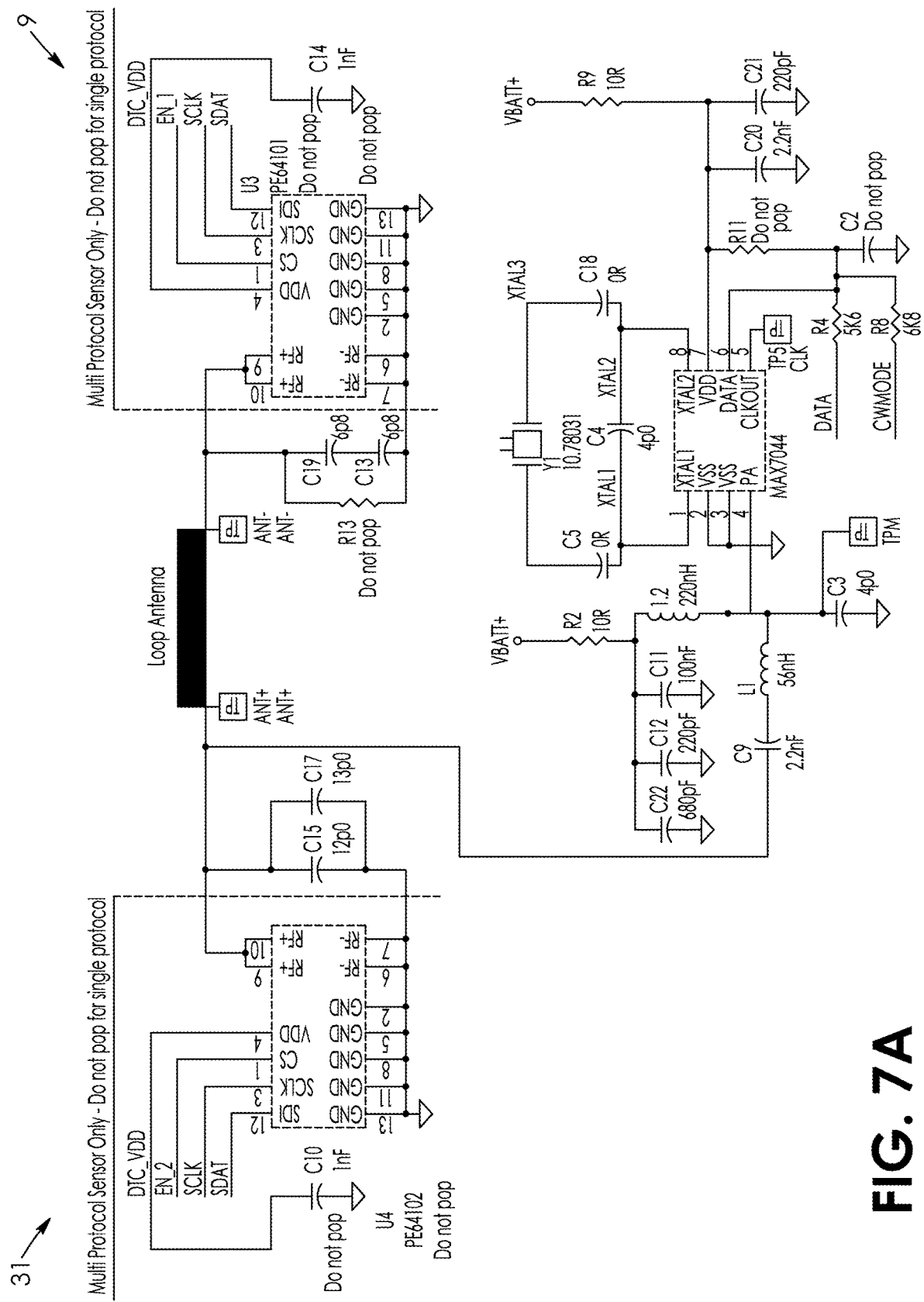
FIGS. 7A to 7E are circuit diagrams of the magnetic field sensor of FIG. 1.
Figure 7B:
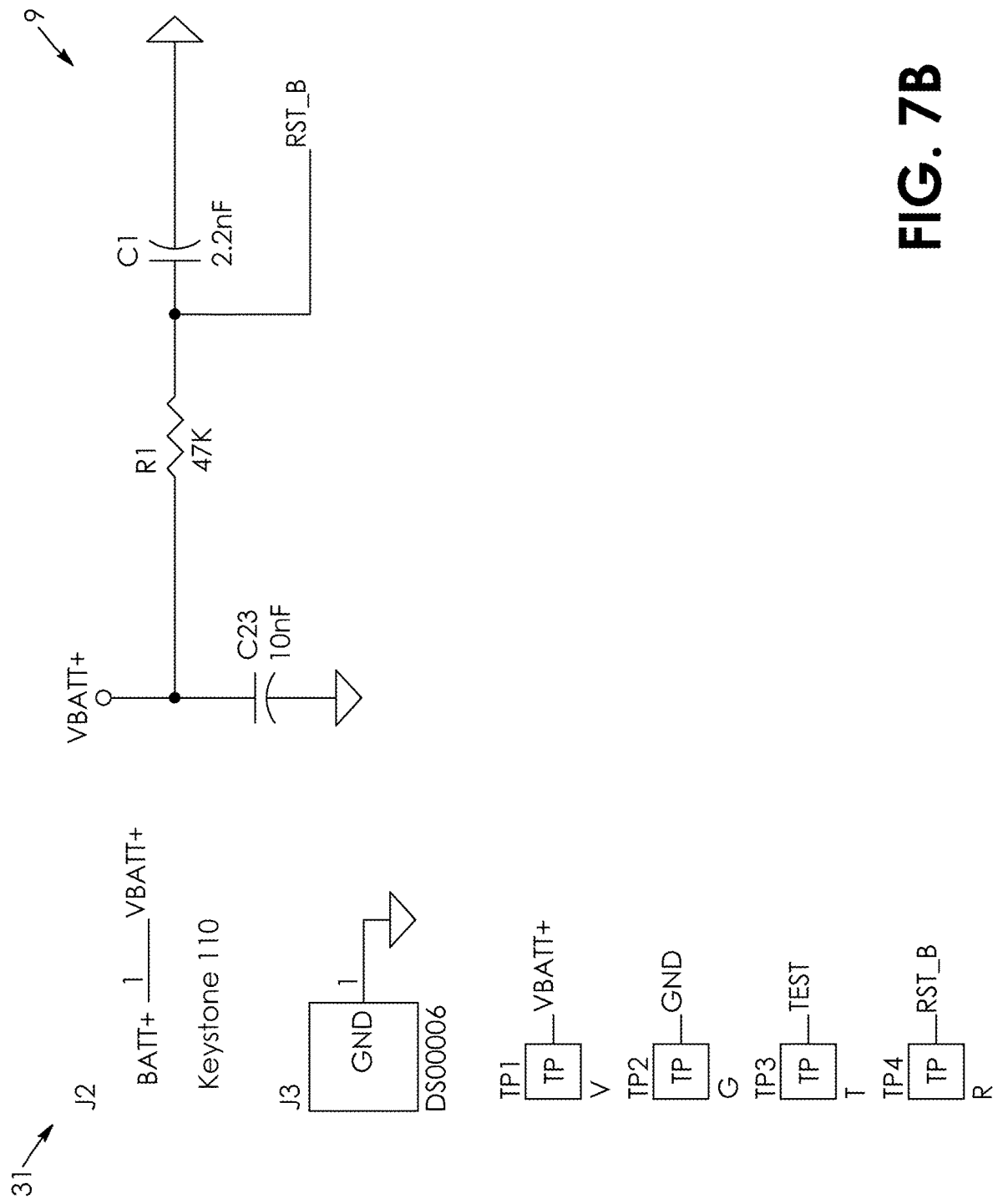
Figure 7C:
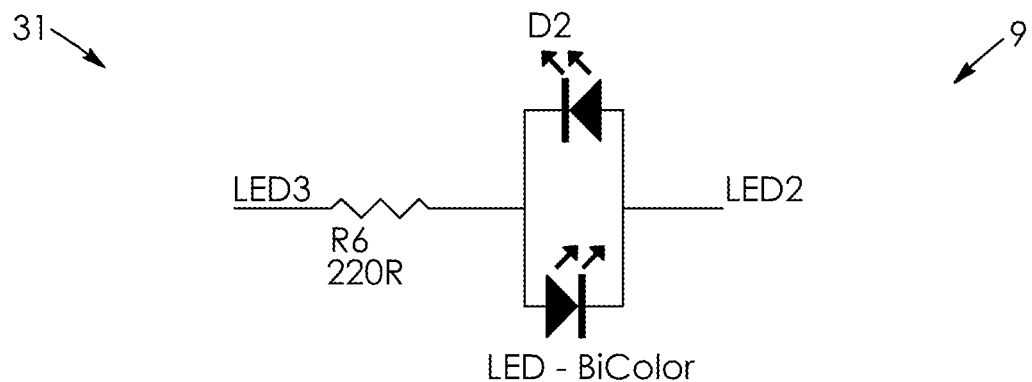
Figure 7C:
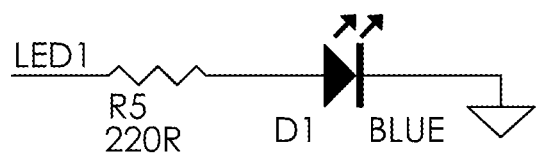
Figure 7C:
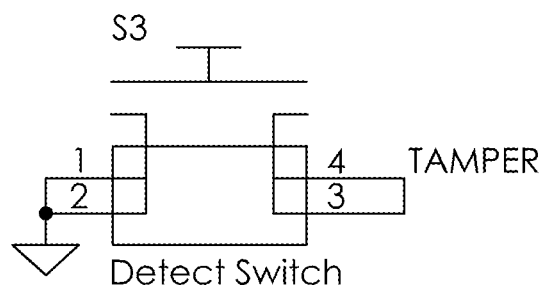
Figure 7C:
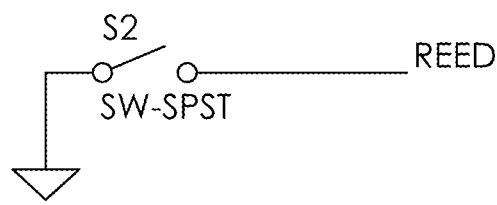
Figure 7C:
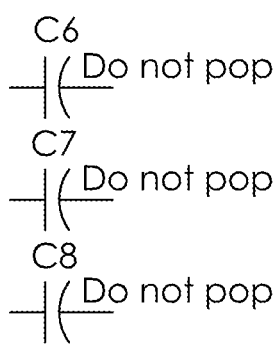
Figure 7D:
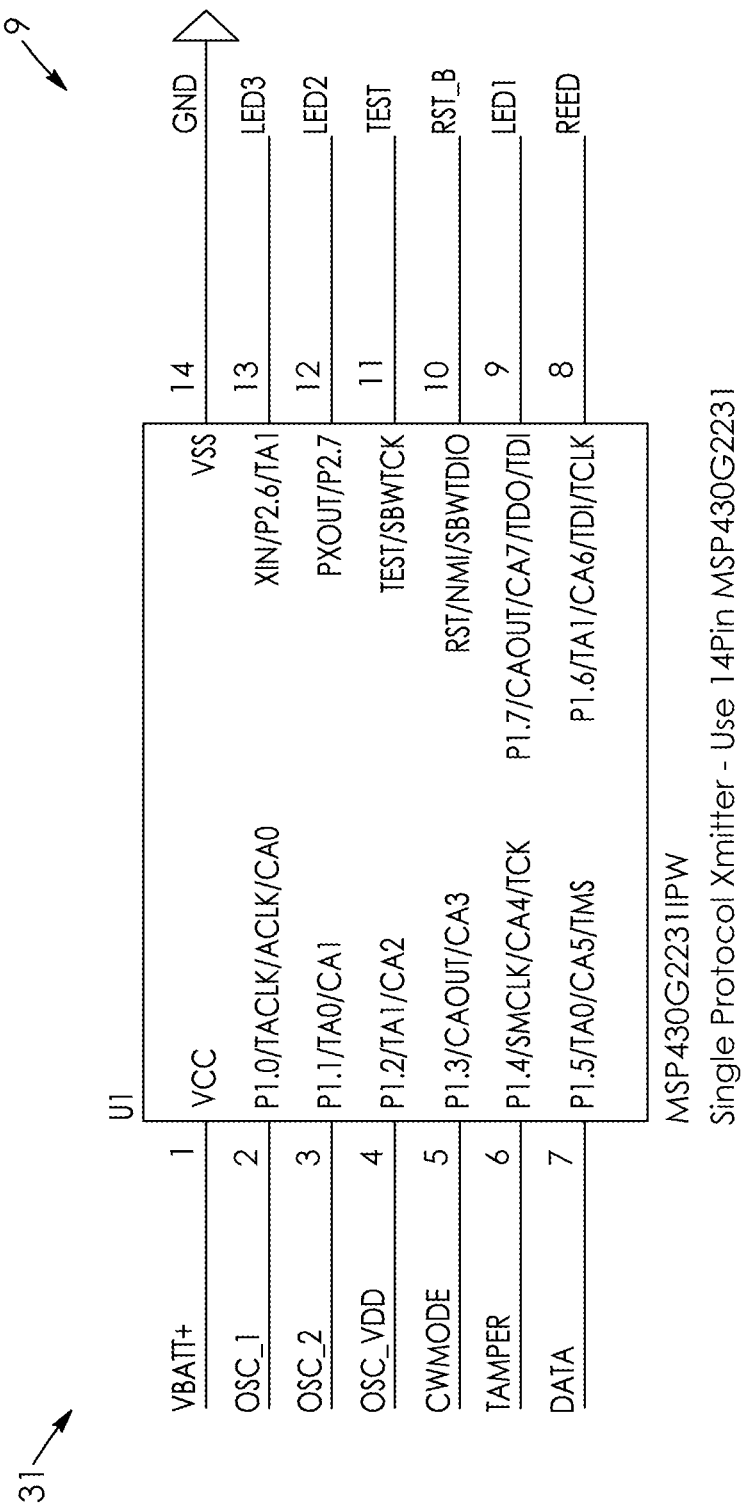
Figure 7E:
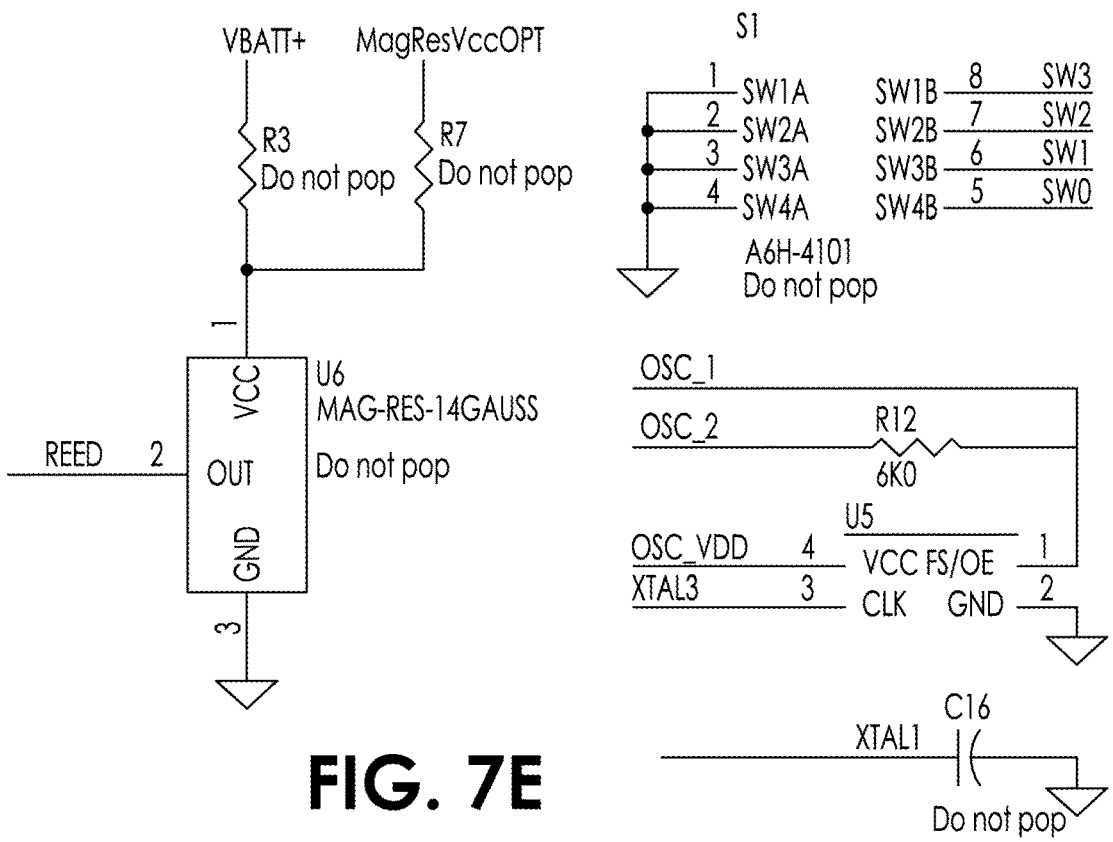

The magnetic field sensor 14 is further provided in this example with a MEMS oscillator 42 which may be programmed to a plurality of discrete frequencies and, in this case, to at least four discrete frequencies which are feed to the radio chip 28 to generate an output frequency ranging between 250 MHz and 1 GHz. The MEMS oscillator 42 is able to provide the at least four discrete frequencies to the radio chip 28 without an additional phase locked loop being required to generate the output frequency, or output signal 41, because the radio chip 28 is provided with a single phase-locked loop 29, for example, a x32 multiplier to generate the output frequency. There is also a dip switch 44 which, in this example, is a four position dip switch. Referring now to FIG. 6, the dip switch 44 is mounted on a side of the circuit board 20 opposite of the indicator light 16. This allows the dip switch 44 to be accessed through an aperture 46 in the housing 18 as shown in FIG. 6. The MEMS oscillator and dip switch are not strictly required and the magnetic field sensor may not have such components in other embodiments.

The microprocessor 22 is programmed with a plurality of data protocols and each output frequency may operate on at least one of the data protocols. The dip switch 44 is actuated to provide a code to the microprocessor 22 and a data protocol is implemented by the microprocessor 22 based on the code. The MEMS oscillator 42 is programmed to a discrete frequency based on the data protocol implemented by the microprocessor 22. The MEMS oscillator 42 then provides the discrete frequency to the radio chip 28 which an output signal 41 based on the discrete frequency. This allows an installer to select a discrete frequency to match the protocol of a given alarm system. Respective ones of digitally tuned capacitor chips 48a and 48b are disposed at each terminal of the antenna 30. The capacitor chips 48a and 48b are used in a shunt mode rather than a series mode to prevent a degradation of antenna performance resulting due to stray capacitance issues when the capacitor chips 48a and 48b are used in series. Using the capacitor chips 48a and 48b in a shunt configuration may allow the antenna 30 to be tuned. The supercapacitor 36 may maintain a maximum output signal by maintaining the voltage at its maximum value during transmission of the output signal. A circuit diagram of the magnetic field sensor is shown in FIGS. 7A to 7E.

Figure 8:
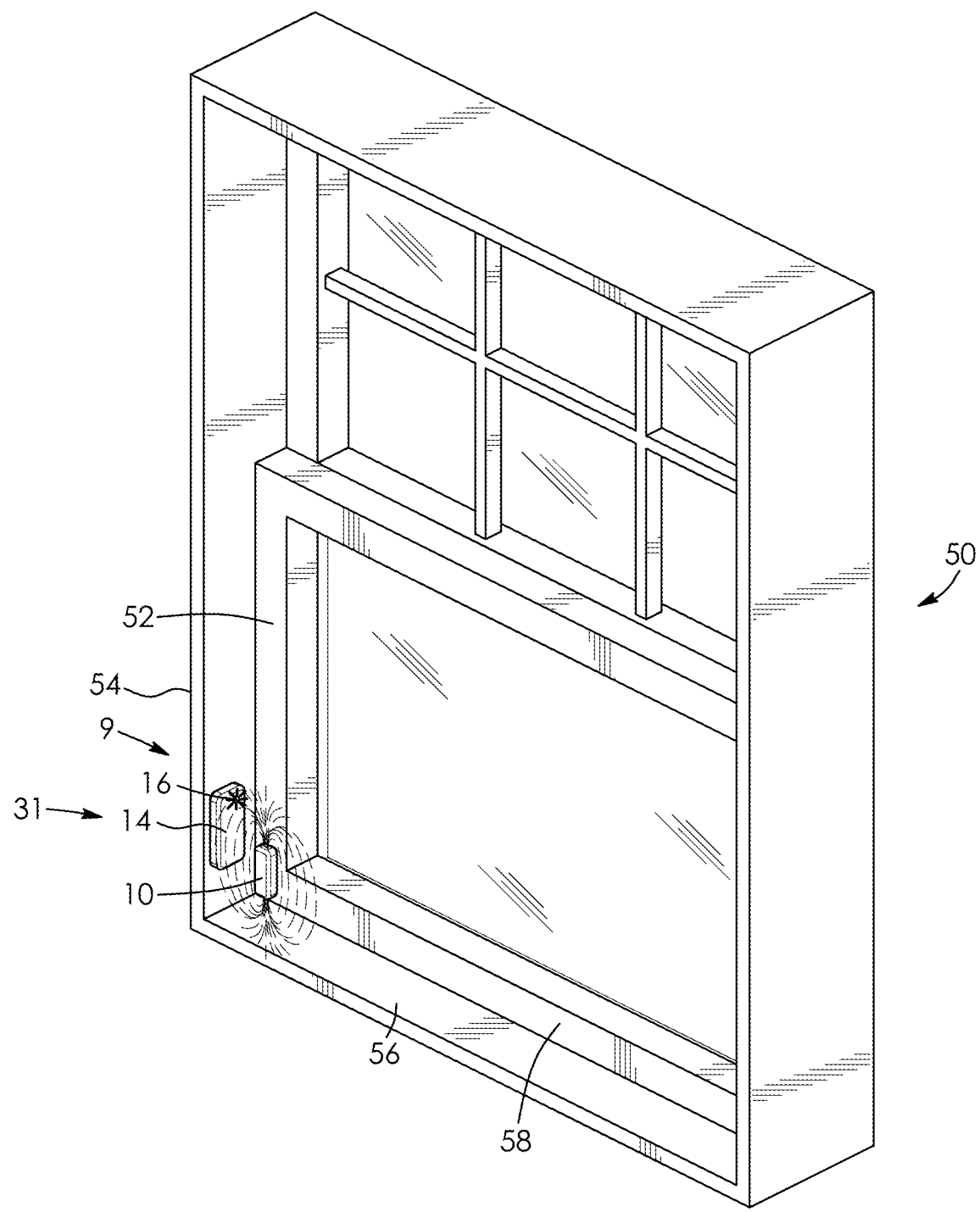
FIG. 8 is a perspective view showing the magnet and the magnetic field sensor of FIG. 1 being used as a window sensor in a security alarm system with the window closed.
Figure 9:
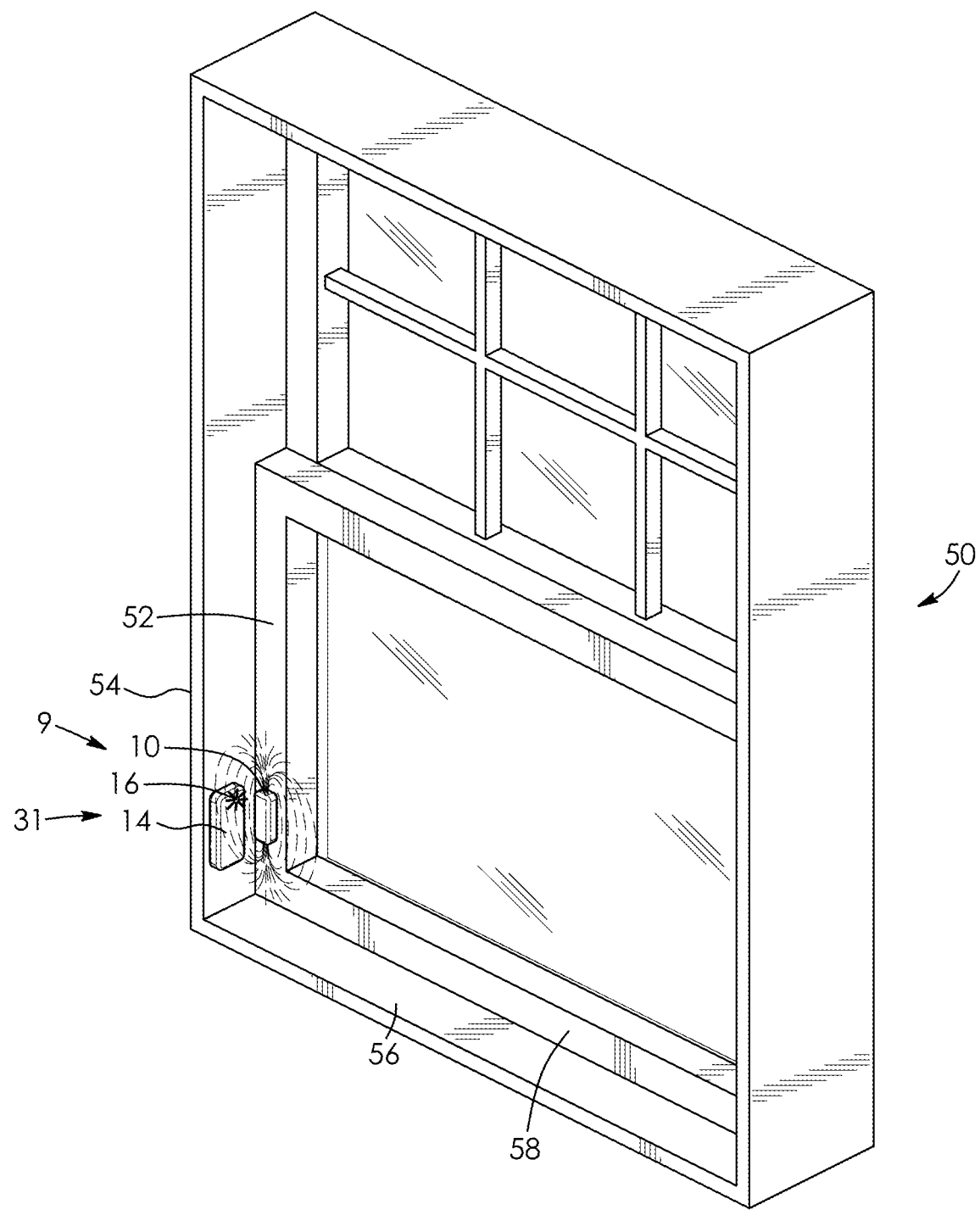
FIG. 9 is another perspective view showing the magnet and the magnetic field sensor of FIG. 1 being used as a window sensor in a security alarm system with the window closed.
Figure 10:
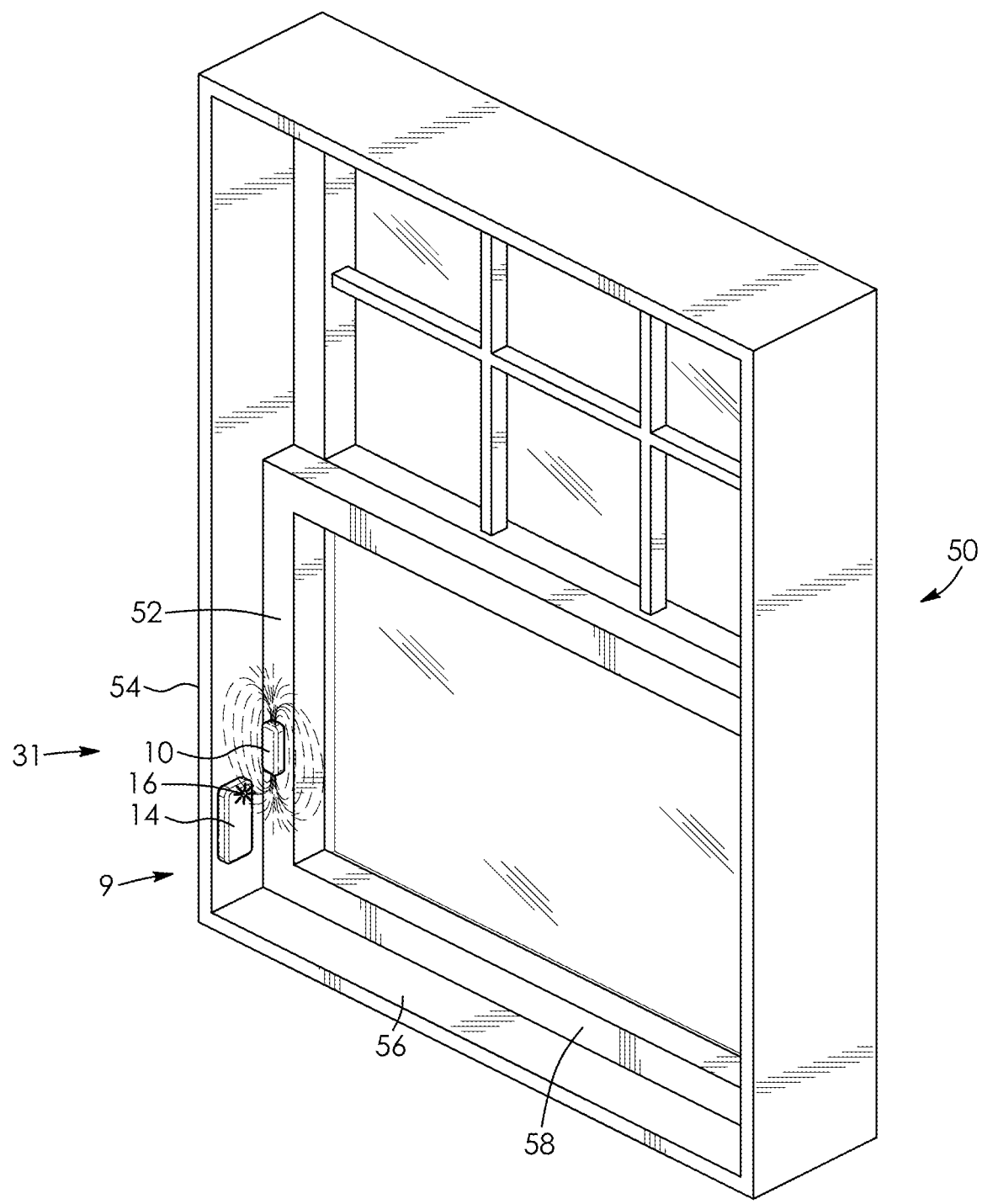
FIG. 10 is a further perspective view showing the magnet and the magnetic field sensor of FIG. 1 being used as a window sensor in a security alarm system with the window closed.

Referring now to FIGS. 8 to 17, the magnet 10 and magnetic field sensor 14 are shown in use as a proximity sensor in the form of a window sensor of a security alarm system. It will however be understood by a person skilled in the art that the magnet 10 and magnetic field sensor 14 may also be used as a door sensor or in any other proximity sensor application. The magnet 10 and magnetic field sensor 14 are each mounted on a window 50 with the magnetic field sensor 14 generally being mounted first, although this is not strictly required. The magnet 10 is mounted on a stile 52 of the window 50 while the magnetic field sensor 14 is mounted on a side jamb 54 of the window near a sill 56 thereof. The window 50 is fully closed in FIGS. 8 to 10 with a bottom rail 58 of the window abutting the sill 56 thereof. When the window 50 is fully closed, the magnetic field sensor 14 is able to sense a magnetic field generated by the magnet 10 when the magnet is mounted along the stile 52 as indicated by the indicator light 16 which is turned on in FIGS. 8 to 10. The indicator light 16 of the magnetic field sensor 14 is turned on when the magnet 10 is mounted on the stile 52 at a first position adjacent to the bottom rail 58 of the window 50 as shown in FIG. 8, at a second position away from the bottom rail 58 of the window 50 as shown in FIG. 9, and at a third position further away from the bottom rail 58 of the window 50 as shown in FIG. 10. This provides a visible confirmation to an installer that, when the magnetic field sensor 14 is mounted on the side jamb 54 of the window 50 near the sill 56 thereof, the magnet 10 may be mounted anywhere on the stile 52 between the first position and the third position for the magnetic field sensor to still be able to sense a magnetic field generated by the magnet. An alarm will accordingly not be triggered when the window 50 is fully closed and the magnet 10 and magnetic field sensor 14 are positioned relative to one another as shown in FIGS. 8 to 10.

Figure 11:
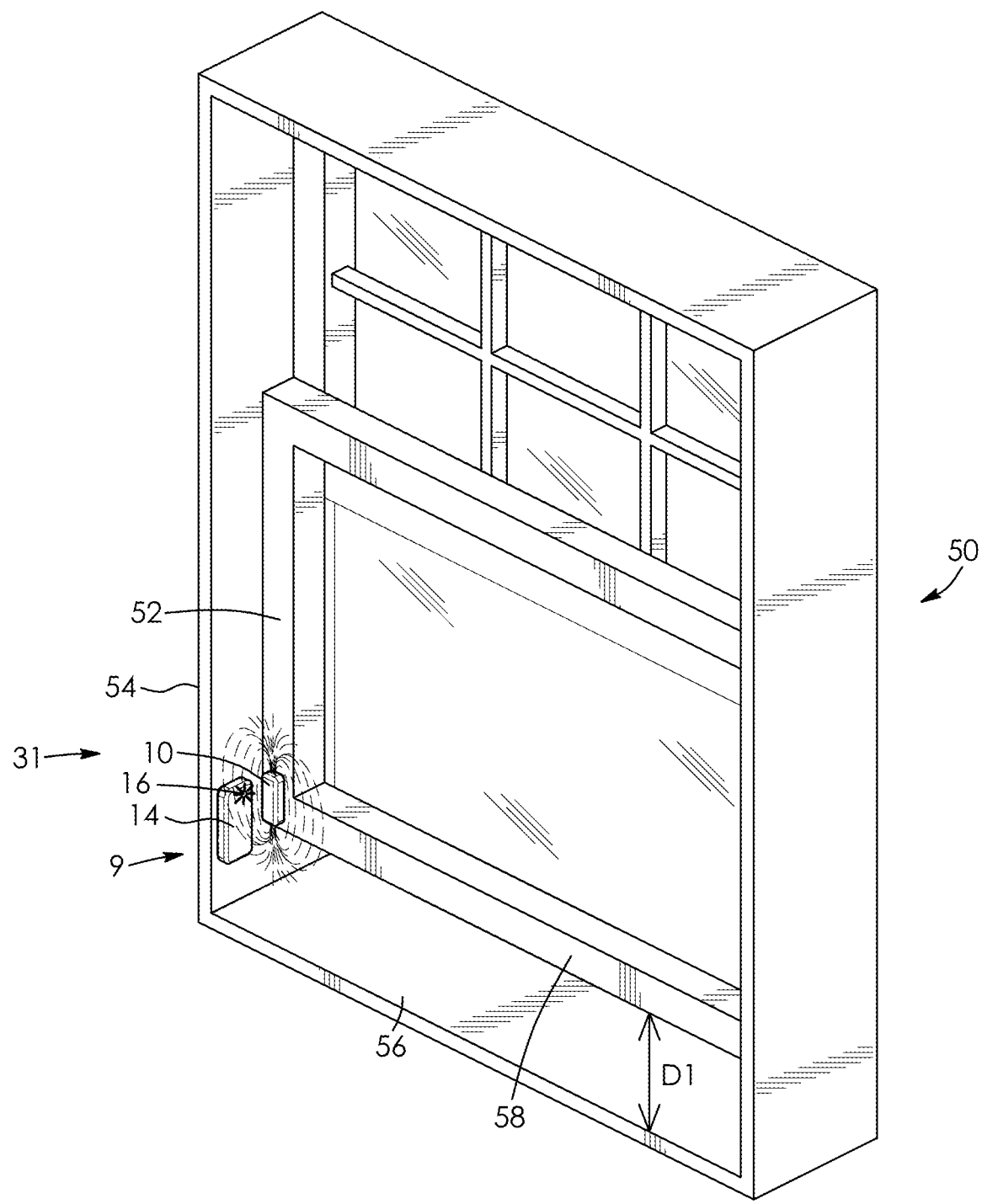
FIG. 11 is a perspective view showing the magnet and the magnetic field sensor of FIG. 1 being used as a window sensor in a security alarm system with the window opened a distance D1.
Figure 12:
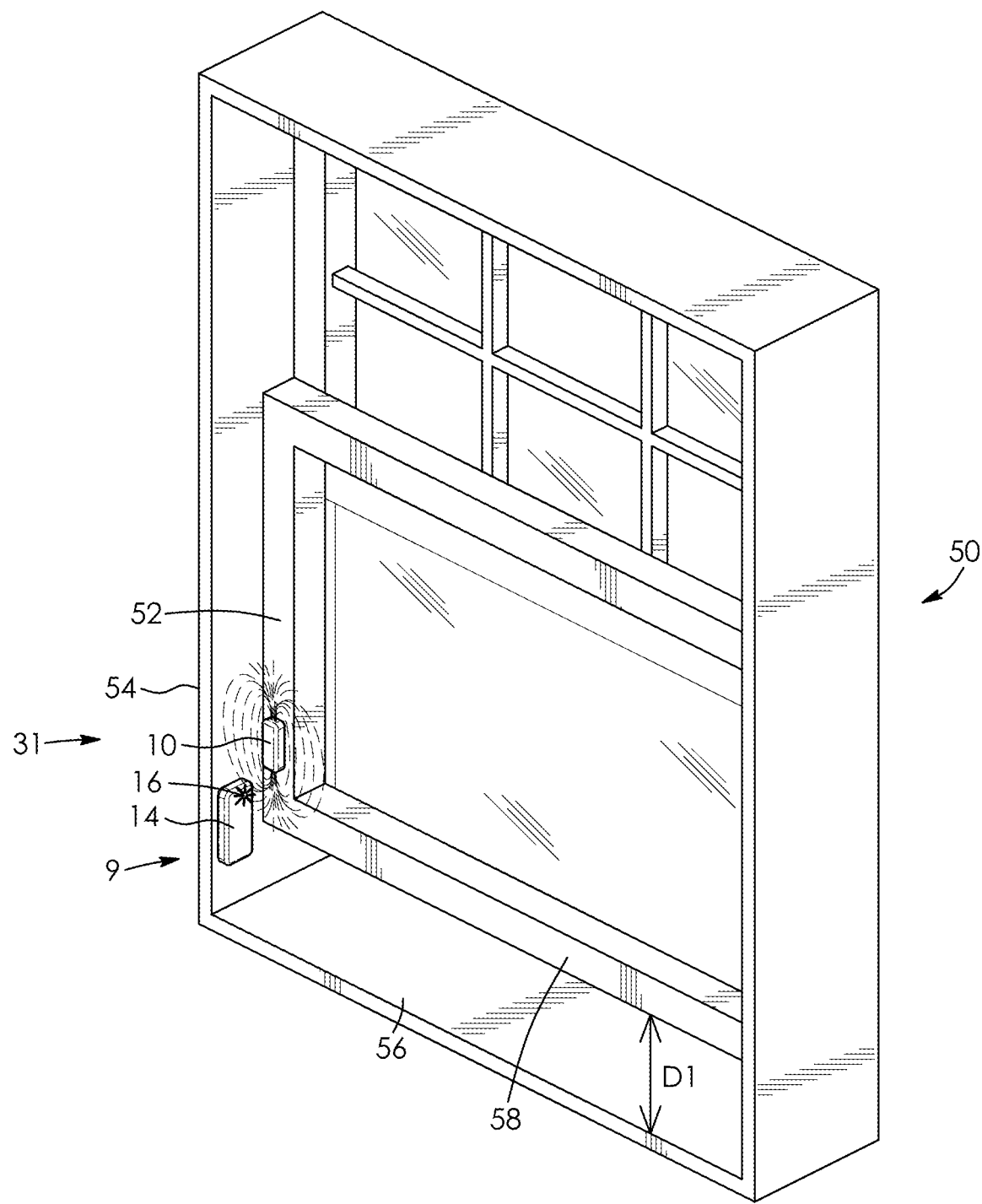
FIG. 12 is another perspective view showing the magnet and the magnetic field sensor of FIG. 1 being used as a window sensor in a security alarm system with the window opened a distance D1.
Figure 13:
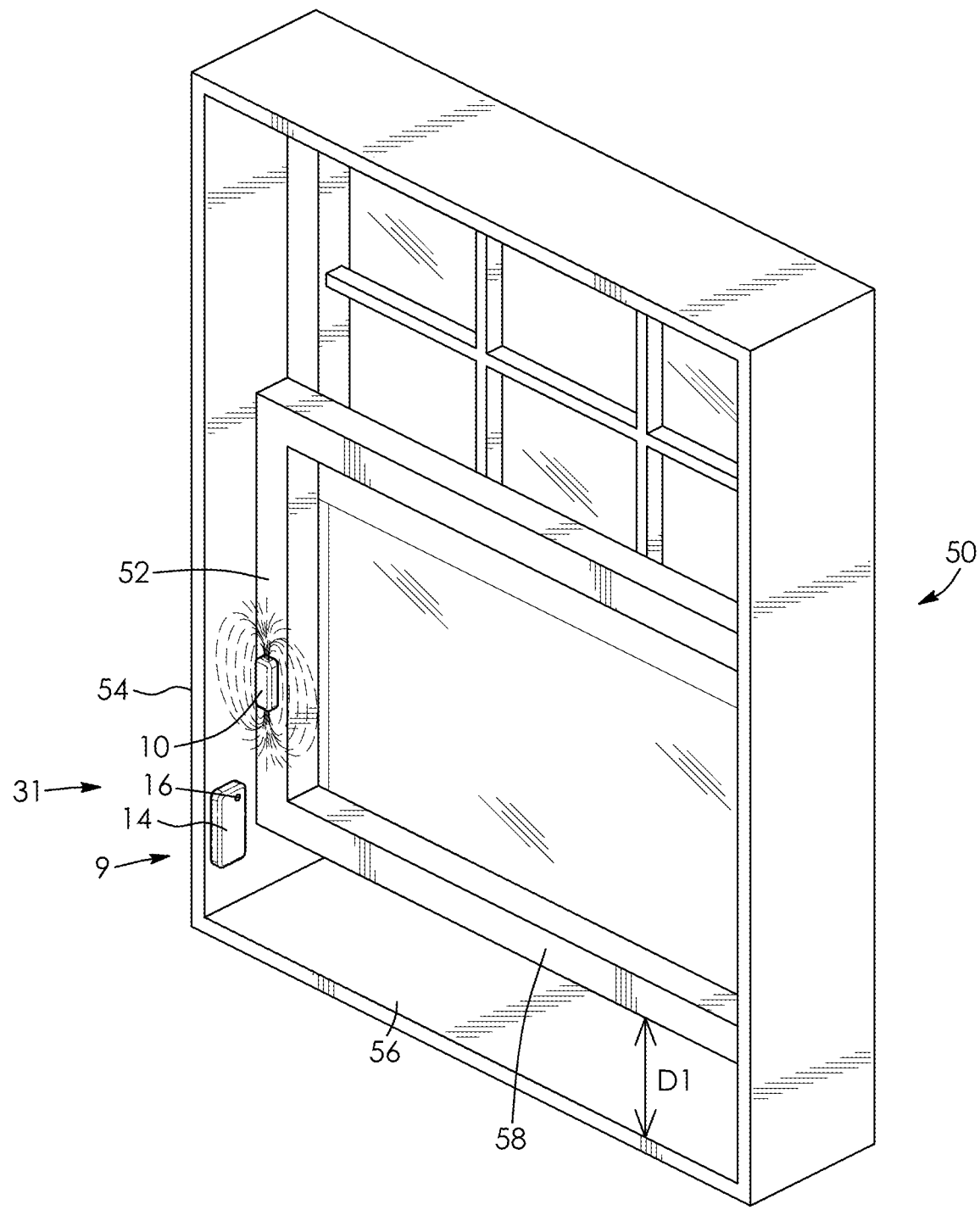
FIG. 13 is a further perspective view showing the magnet and the magnetic field sensor of FIG. 1 being used as a window sensor in a security alarm system with the window opened a distance D1.

However, it may be desirable for an alarm to not be triggered when the window 50 is not fully closed. This would allow the window 50 to be partially opened for ventilation but not enough to allow an intruder to enter through the window. For example, as shown in FIGS. 11 to 13, it may be desired to allow the window 50 to be opened a distance of D1 without triggering an alarm. FIG. 11 shows that the magnetic field sensor 14 is able to sense the magnetic field generated by the magnet 10, as visually indicated by the indicator light 16 which is turned on, when the magnet 10 is mounted on the stile 52 adjacent to the bottom rail 58. FIG. 12 shows that the magnetic field sensor 14 is also able to sense the magnetic field generated by the magnet 10, as visually indicated by the indicator light 16 which is turned on, when the magnet 10 is mounted on the stile 52 away from the bottom rail 58. FIG. 13 shows that the magnetic field sensor 14 is unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer as to where on the stile 52 the magnet 10 may be mounted to allow the window 50 to be opened a distance of D1 without triggering an alarm.

Figure 14:
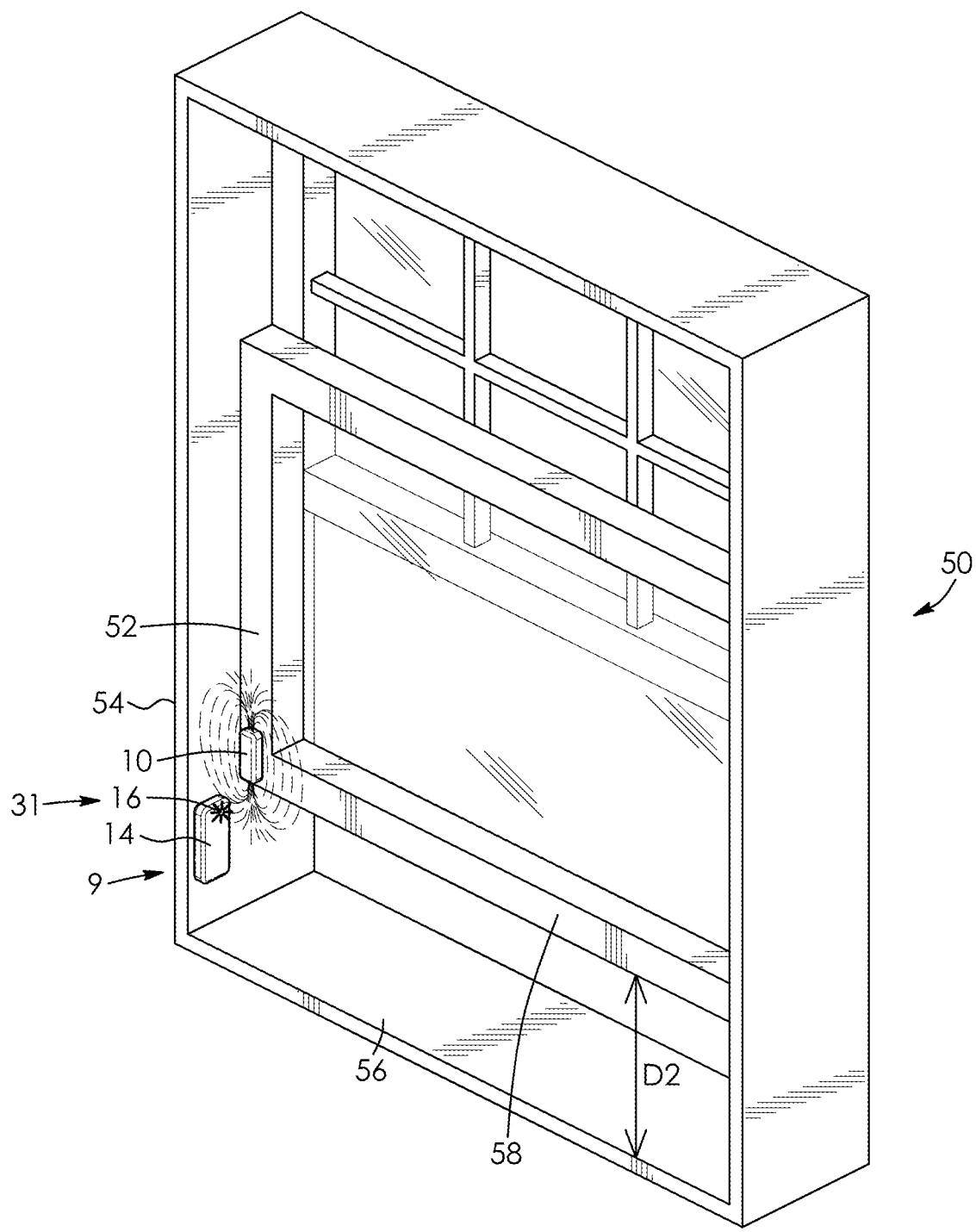
FIG. 14 is a perspective view showing the magnet and the magnetic field sensor of FIG. 1 being used as a window sensor in a security alarm system with the window opened a distance D2.
Figure 15:
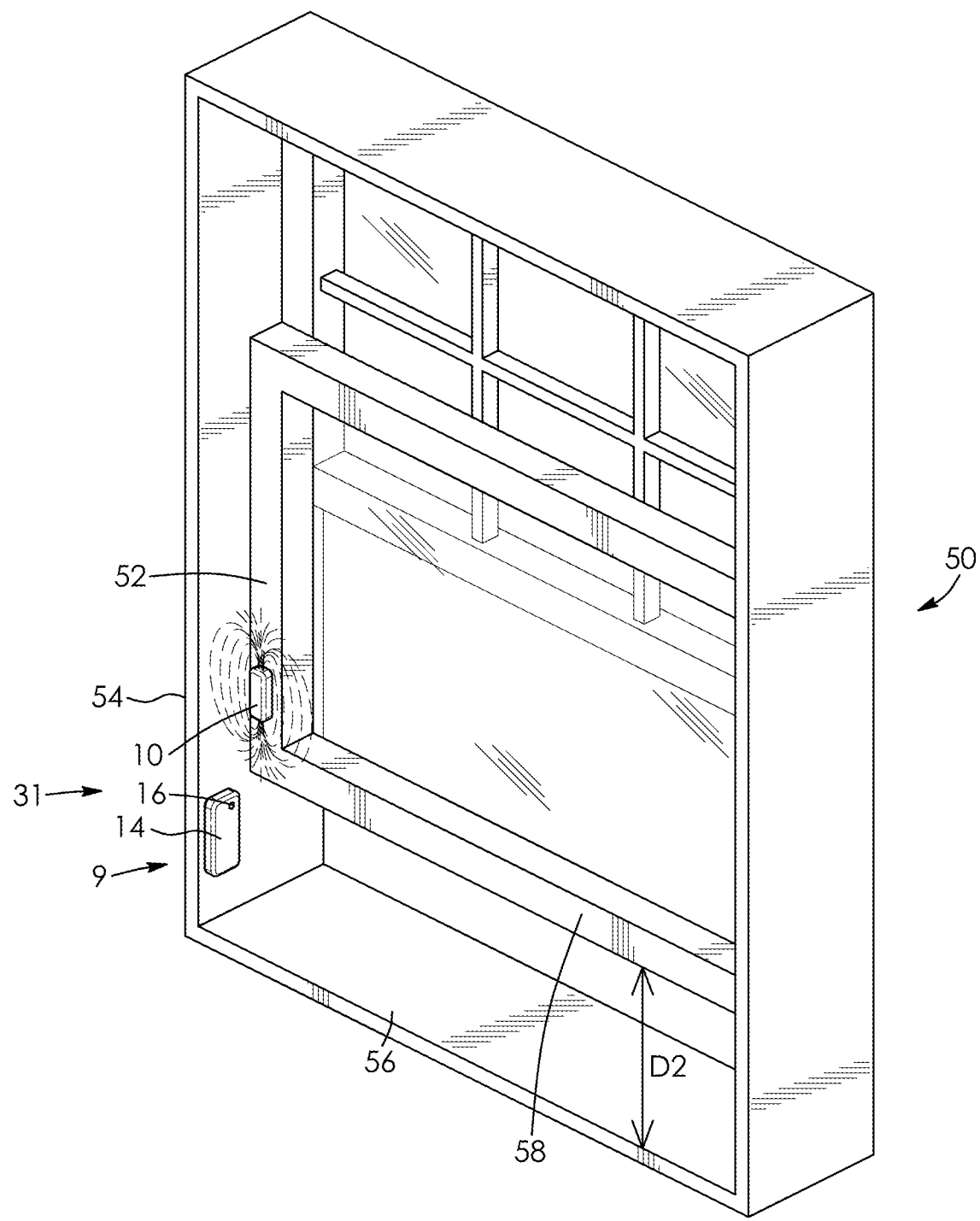
FIG. 15 is another perspective view showing the magnet and the magnetic field sensor of FIG. 1 being used as a window sensor in a security alarm system with the window opened a distance D2.
Figure 16:
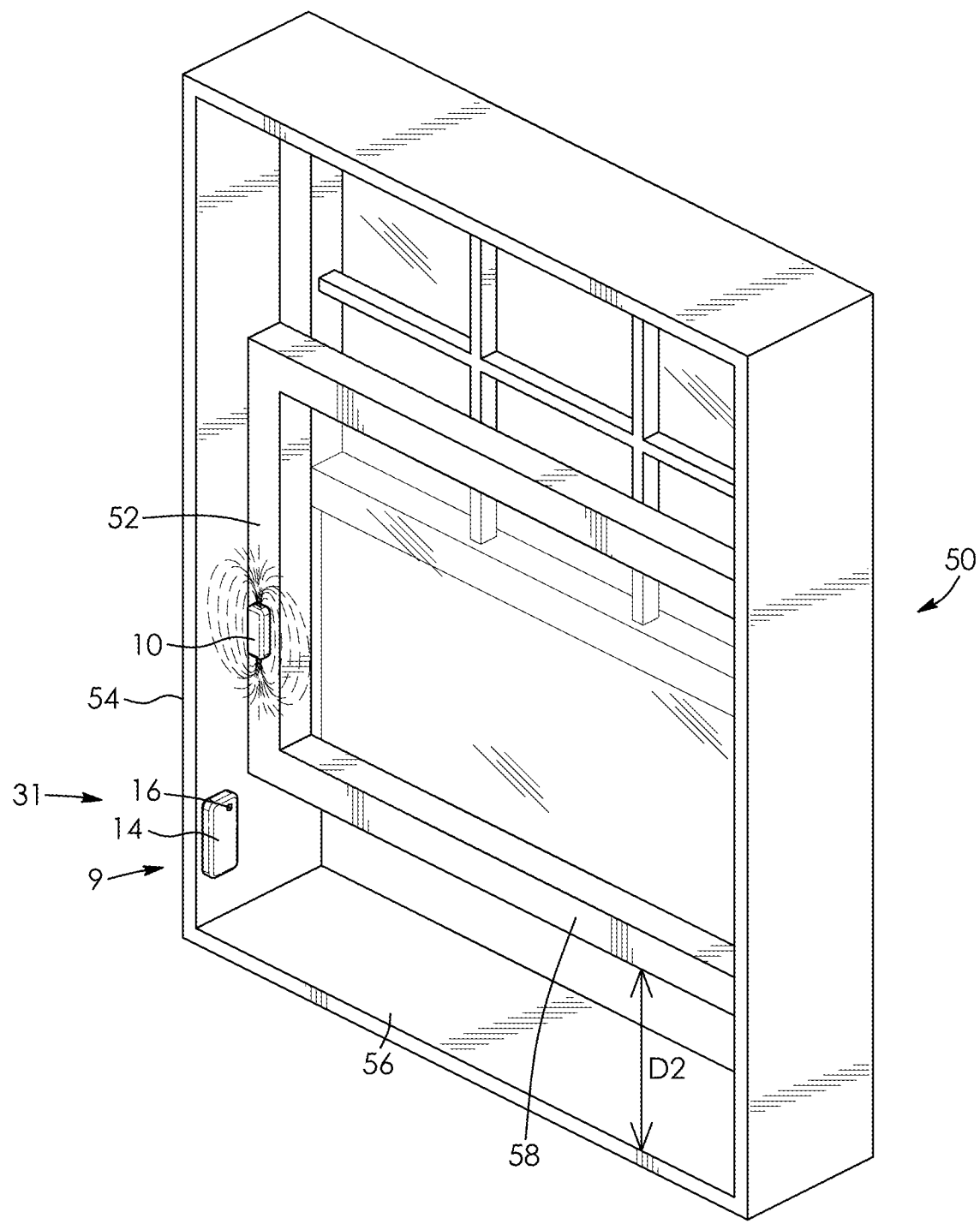
FIG. 16 is a further perspective view showing the magnet and the magnetic field sensor of FIG. 1 being used as a window sensor in a security alarm system with the window opened a distance D2.
Figure 17:
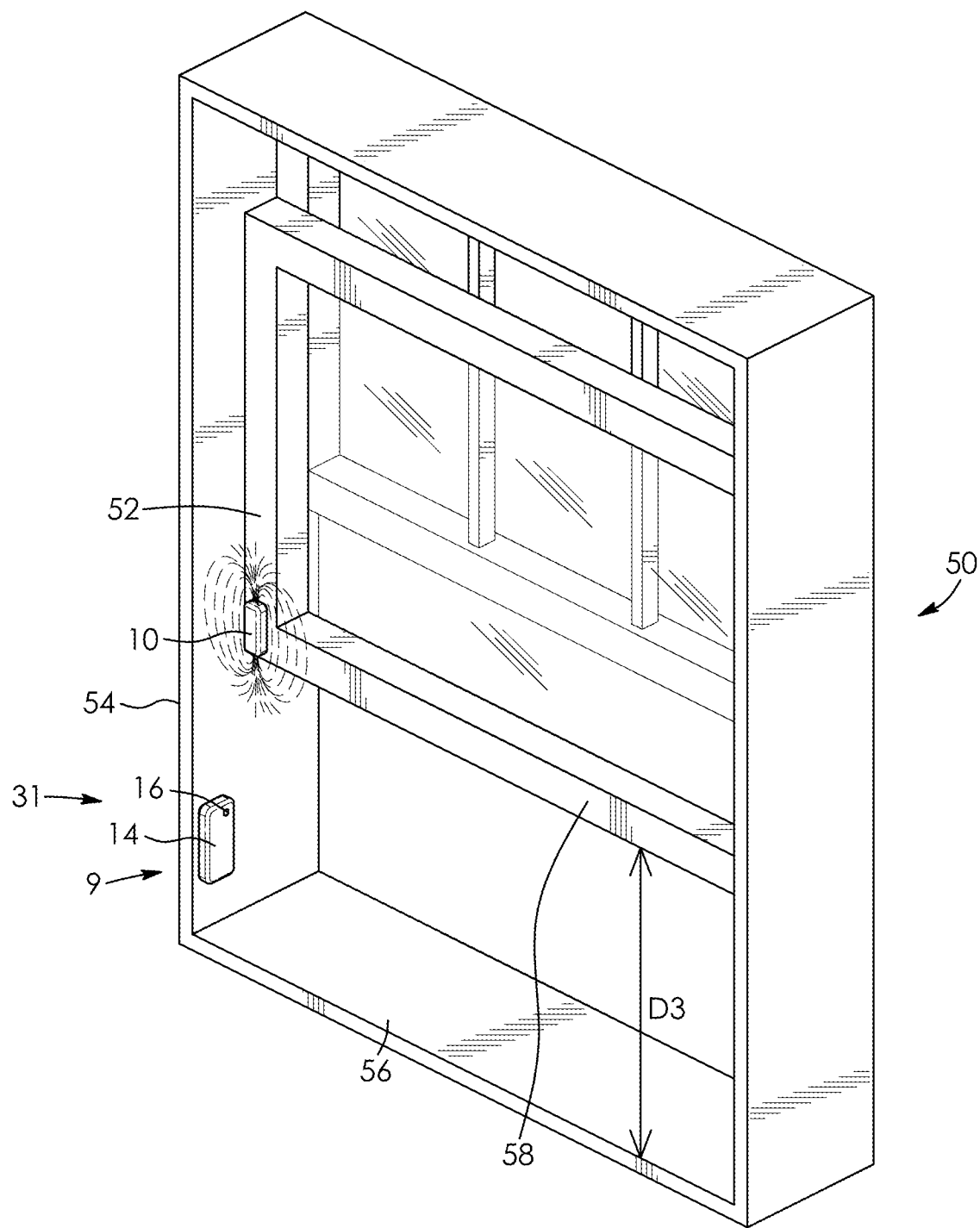
FIG. 17 is a perspective view showing the magnet and the magnetic field sensor of FIG. 1 being used as a window sensor in a security alarm system with the window opened a distance D3.

FIGS. 14 to 16 show where the magnet 10 may be positioned to avoid triggering an alarm when the window is opened a distance of D2 which is greater than D1. FIG. 14 shows that the magnetic field sensor 14 is able to sense a magnetic field generated by the magnet 10, as visually indicated by the indicator light 16 which is turned on, when the magnet 10 is mounted on the stile 52 adjacent to the bottom rail 58. FIG. 15 shows that the magnetic field sensor 14 is unable to sense the magnetic field generated by the magnet 10, as visually indicated by the indicator light 16 which is turned off, when the magnet 10 is mounted on the stile 52 away from the bottom rail 58. FIG. 16 shows that the magnetic field sensor 14 is also unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer that the magnet 10 should be mounted on the stile 52 adjacent to the bottom rail 58, allowing the window 50 to be opened a distance of D2 without triggering an alarm. However, as shown in FIG. 17, opening the window a distance of D3 which is greater than D2 will trigger an alarm even if the magnet 10 is mounted on the stile 52 adjacent to the bottom rail 58. The indicator light 16 accordingly provides an installer with a visual indication to verify correct placement of the magnet 10 to allow a maximum threshold opening of the window 50. It will be understood by a person skilled in the art that mounting the magnet 10 on the stile 52 of the window 50 and mounting the magnetic field sensor 14 on the side jamb 54 of the window is only an example. The magnet 10 and the magnetic field sensor 14 may be mounted anywhere provided there is relative movement of the magnet 10 and the magnetic field sensor 14 when the window 50 is opened.

Figure 18:
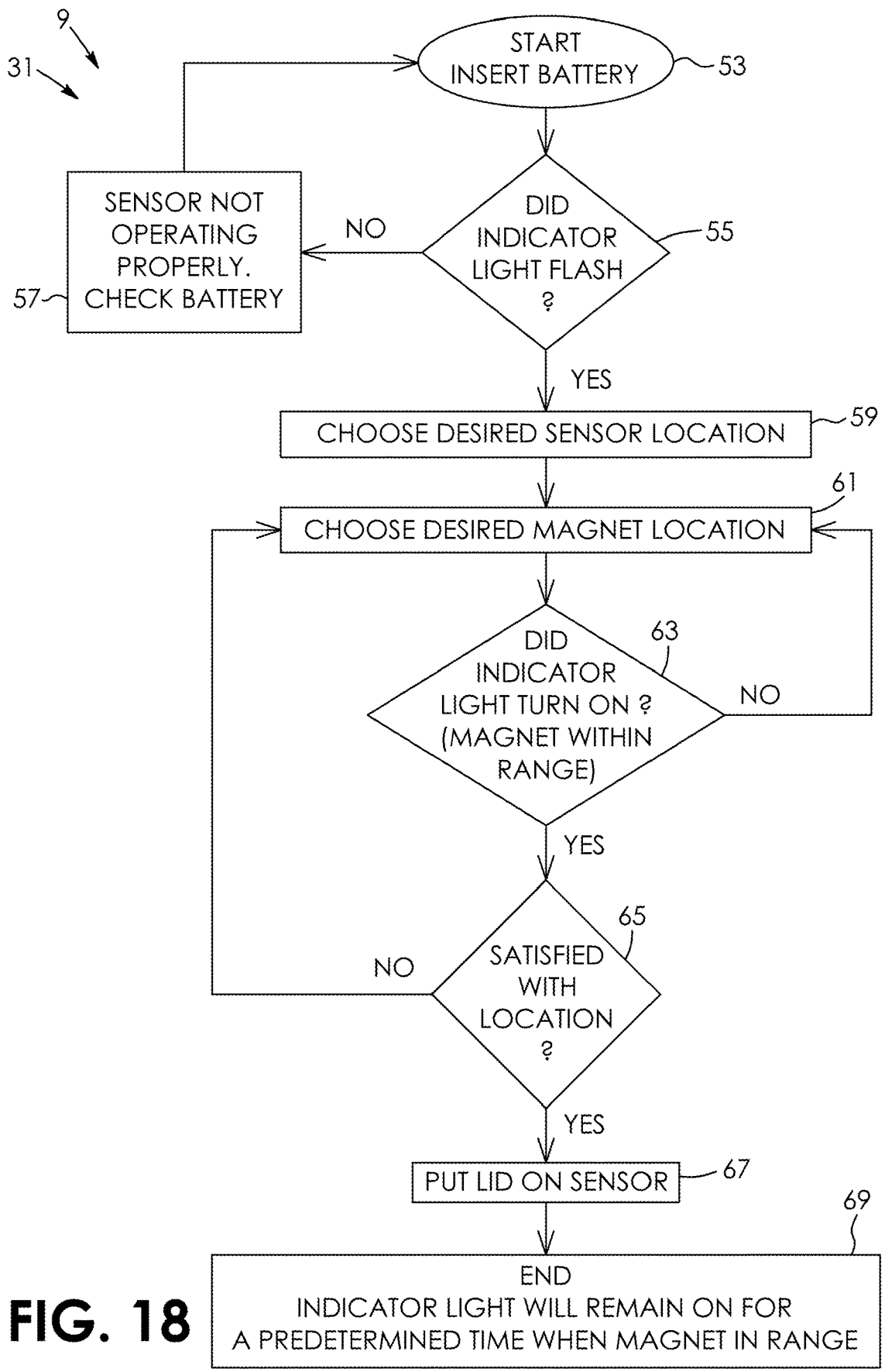
FIG. 18 is a flow chart showing the logic of installing the magnet and the magnetic field sensor of FIG. 1 relative to each other.

FIG. 18 is a flow chart showing the logic of installing the magnet 10 and magnetic field sensor 14 relative to each other. In this embodiment the coin cell battery 24 is first inserted into the magnetic field sensor 14, as shown by box 53. It is next determined if the indicator light flashes, as shown by box 55, to indicate that the magnetic field sensor 14 seen in FIG. 17 has powered up and is functioning properly. If the indicator light 16 does not flash, then the magnetic field sensor 14 is not functioning properly and the coin cell battery 24 is removed and replaced, as shown by box 57 in FIG. 18.

Referring to FIGS. 8 and 18, the magnetic field sensor 14 is next positioned in a desired location, as shown by box 59, and the magnet 10 positioned in a desired location relative to the magnetic field sensor 14, as shown by box 61. It is next determined if the indicator light turns on based on whether the magnet is within range, as shown by box 63. The indicator light 16 will turn on when a magnetic field generated by the magnet 10 is sensed by the magnetic field sensor 14, as seen in FIGS. 8 to 12 and 14 and the indicator light 16 will turn off when a magnetic field generated by the magnet 10 is not sensed by the magnetic field sensor 14, as seen in FIGS. 13 and 15 to 17. The indicator light 16 accordingly assists an installer in determining proper relative positioning of the magnet 10 and magnetic field sensor 14. This allows the window 50 to be opened a certain distance without triggering the alarm. Once the installer is satisfied with the relative positioning of the magnet 10 and magnetic field sensor 14 as shown by box 65 in FIG. 18, the lid 19 of the magnetic field sensor 14 is closed, as shown by box 67. The indicator light 16 will then remain on for a predetermined period of time when a magnetic field generated by the magnet 10 is sensed by the magnetic field sensor 14, as shown by box 69.

Referring to FIG. 4, the magnetic field sensor 14 is further provided with software having an algorithm which turns off the indicator light 16 after a predetermined period of time even if the magnetic field sensor 14 senses a magnetic field. This conserves the coin cell battery 24 of the magnetic field sensor 14 and does away with any visual annoyance resulting from the indicator light 16 being turned on when the window 50 is closed or opened less than a maximum threshold opening required to trigger an alarm. Referring to FIGS. 8 and 13, the magnetic field sensor 14 will however continue to otherwise operate normally and transmit a signal to trigger an alarm when the window 50 is opened and the magnetic field sensor 14 no longer senses a magnetic field generated by the magnet 10. The indicator light 16 is accordingly operable during installation of the window sensor and assists an installer in determining the relative positioning of the magnet 10 and magnetic field sensor 14 so as to allow the window 50 to be opened a certain distance without triggering the alarm. If an installer is unable to position the magnet 10 and magnetic field sensor 14 within the predetermined period of time before the software turns off the indicator light 16 then the lid 19 of the magnetic field sensor 14 can be removed to restart the algorithm. Replacing of the lid 19 will result in another predetermined period of time in which the indicator light 16 is operable to assist an installer in determining the relative positioning of the magnet 10 and magnetic field sensor 14 so as to allow the window 50 to be opened a certain distance without triggering the alarm.

Figure 19:
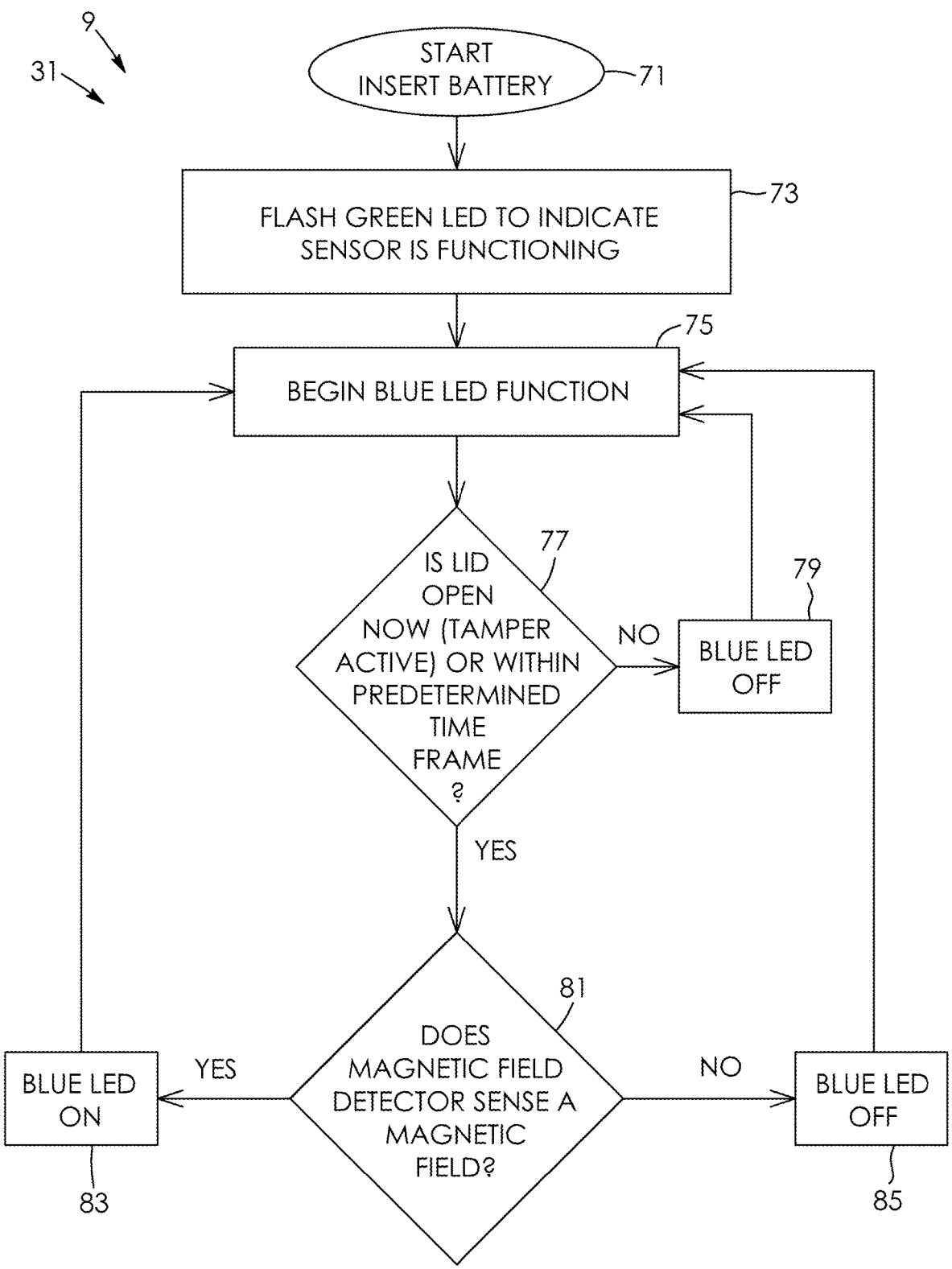
FIG. 19 is a flow chart showing the logic of a software algorithm which drives the magnetic field sensor of FIG. 1.

FIG. 19 is a flow chart showing the logic of the algorithm. In this embodiment the coin cell battery 24 seen in FIG. 4 is first inserted into the magnetic field sensor 14, as shown by box 71 in FIG. 19. Referring to FIGS. 8 and 19 and as shown by box 73 the green light-emitting diode of the indicator light 16 thereafter turns on for a period of time, for example, five seconds. This indicates that the magnetic field sensor 14 has powered up and is functioning properly. The blue light-emitting diode of the indicator light 16 will then be operable, as shown by box 75. The magnet 10 and the magnetic field sensor 14 are next positioned relative to one another as shown in FIGS. 7 to 16. The blue light-emitting diode of the indicator light 16 will turn on when a magnetic field generated by the magnet 10 is sensed by the magnetic field sensor 14 and the blue light-emitting diode of the indicator light 16 will turn off when a magnetic field generated by the magnet 10 is not sensed by the magnetic field sensor 14. The indicator light 16 accordingly assists an installer in determining proper relative positioning of the magnet 10 and magnetic field sensor 14. Proper relative positioning of the magnet 10 and magnetic field sensor 14 may allow the window 50 to be opened a certain distance without triggering the alarm.

If an installer is unable to position the magnet 10 and magnetic field sensor 14 within the predetermined period of time before the software turns off the indicator light 16 then the lid 19 can be removed to restart the algorithm as shown in FIG. 18. Thus the magnetic field sensor determines if the lid thereof is open or still within the predetermined period of time, as shown by box 77. If the predetermined period of time has expired, the blue LED light is turned off, as shown by box 79 in FIG. 19. If the lid is open and then closed, the predetermined period of time begins once more and it is next determined whether the magnetic field sensor senses a magnetic field, as shown by box 81. If yes, the blue LED light will turn on as shown by box 83. If no magnetic field is sensed by the magnetic field sensor, the blue LED light remains off, as shown by box 85, and the positioning of the magnetic field sensor relative to the magnet will need to be adjusted.

A red light-emitting diode of the indicator light 16 will flash when the coin cell battery 24 runs down below a predetermined low battery threshold in this example. The frequency of the flashing will increase as the battery continues to run down.

Figure 20:
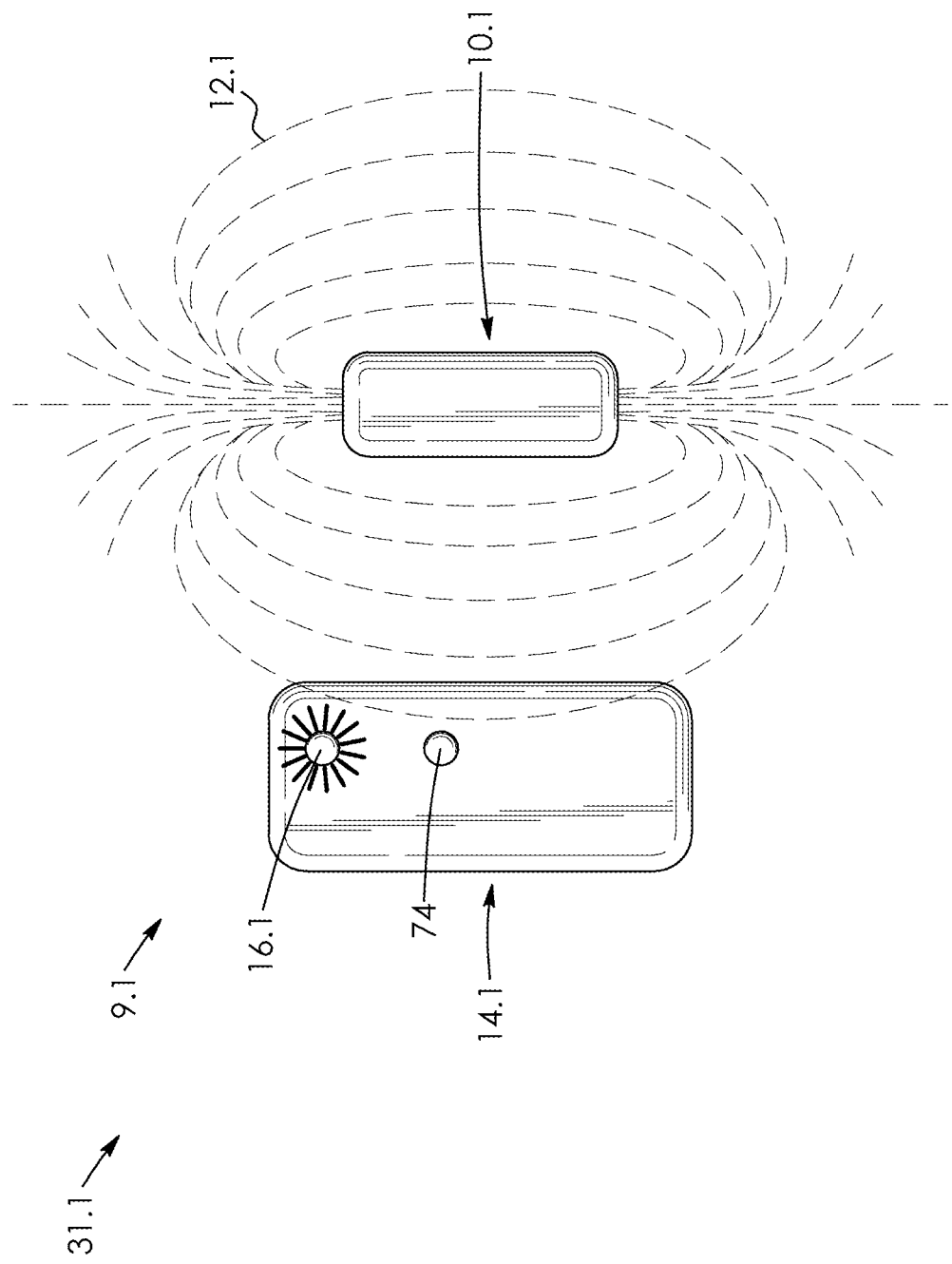
FIG. 20 is a perspective view of a sensor assembly according to a second aspect, the sensor assembly comprising a magnet and a magnetic field sensor.
Figure 21:
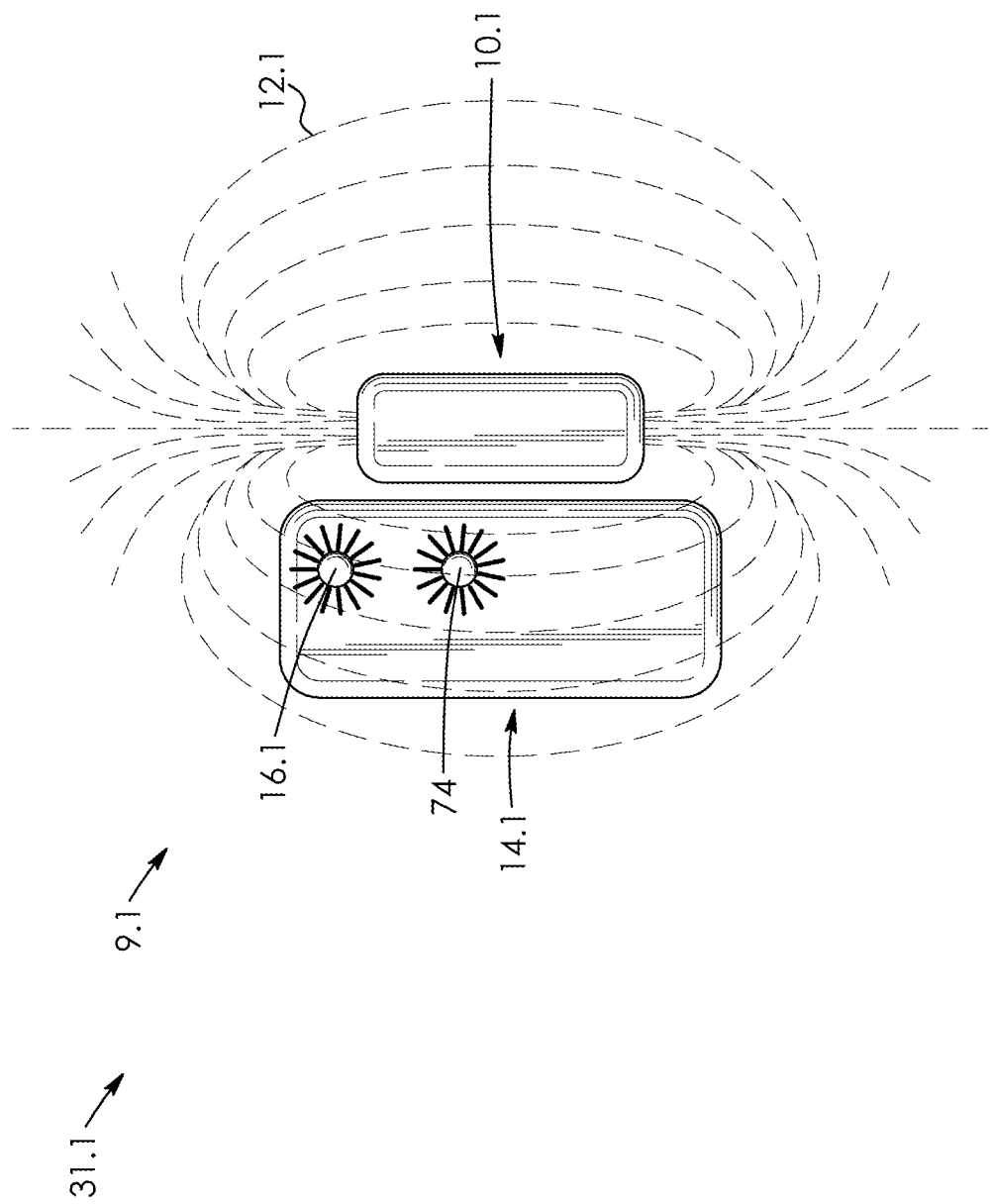
FIG. 21 is another perspective view of the magnet and the magnetic field sensor of FIG. 20.

The software may run other routines as set out below during operation of the magnetic field sensor 14.

task 1:
  if tamper switch active (lid open) now or within past three minutes:
    if magnet is present:
      blue light-emitting diode ON
    else
      blue light-emitting diode OFF task 2
  if magnet becomes present or magnet becomes absent:
    send magnet-change message
      if battery is failing
        blink red light-emitting diode
      else
        if tamper switch active (lid open) now or within past three minutes:
          blink green light-emitting diode task 3:
  if approximately one hour has passed with no message sent:
    send supervisory message FIGS. 20 to 21 show a sensor assembly 9.1 including a magnet 10.1 and magnetic field sensor 14.1 according to a second aspect. Like parts have like numbers and functions as the sensor assembly 9, magnet 10 and magnetic field sensor 14.1 shown in FIGS. 1 to 19 with the addition of decimal extension "0.1". Assembly 9.1 is substantially the same as assembly 9 shown in FIGS. 1 to 19 with the following exceptions.

Magnetic field sensor 14.1 has a first indicator light 16.1 and a second indicator light 74. The first indicator light 16.1 functions in a manner substantially identical to the indicator light 16 of the magnetic field sensor 14 shown in FIGS. 1 to 19. The first indicator light accordingly provides a visual indication as to the presence or absence of a magnetic field. The second indicator light 74 provides a visual indication as to the strength of a magnetic field. The first indicator light 16.1 turns on when the magnetic field sensor 14.1 is within the magnetic field 12.1 generated by the magnet 10. However, as shown in FIG. 20, the second indicator light 74 does not turn on when the magnetic field sensor 14.1 is merely near a periphery of the magnetic field 12.1. The second indicator light 74 only turns on when the magnetic field sensor 14.1 is well within the magnetic field 12.1 as shown in FIG. 21. This allows an installer to see the best range for the relative positioning of the magnet 10.1 and magnetic field sensor 14.1. The second indicator light 74 is turned on by a microprocessor when a second, parallel device such as a reed switch senses a magnetic field.

Figure 22:
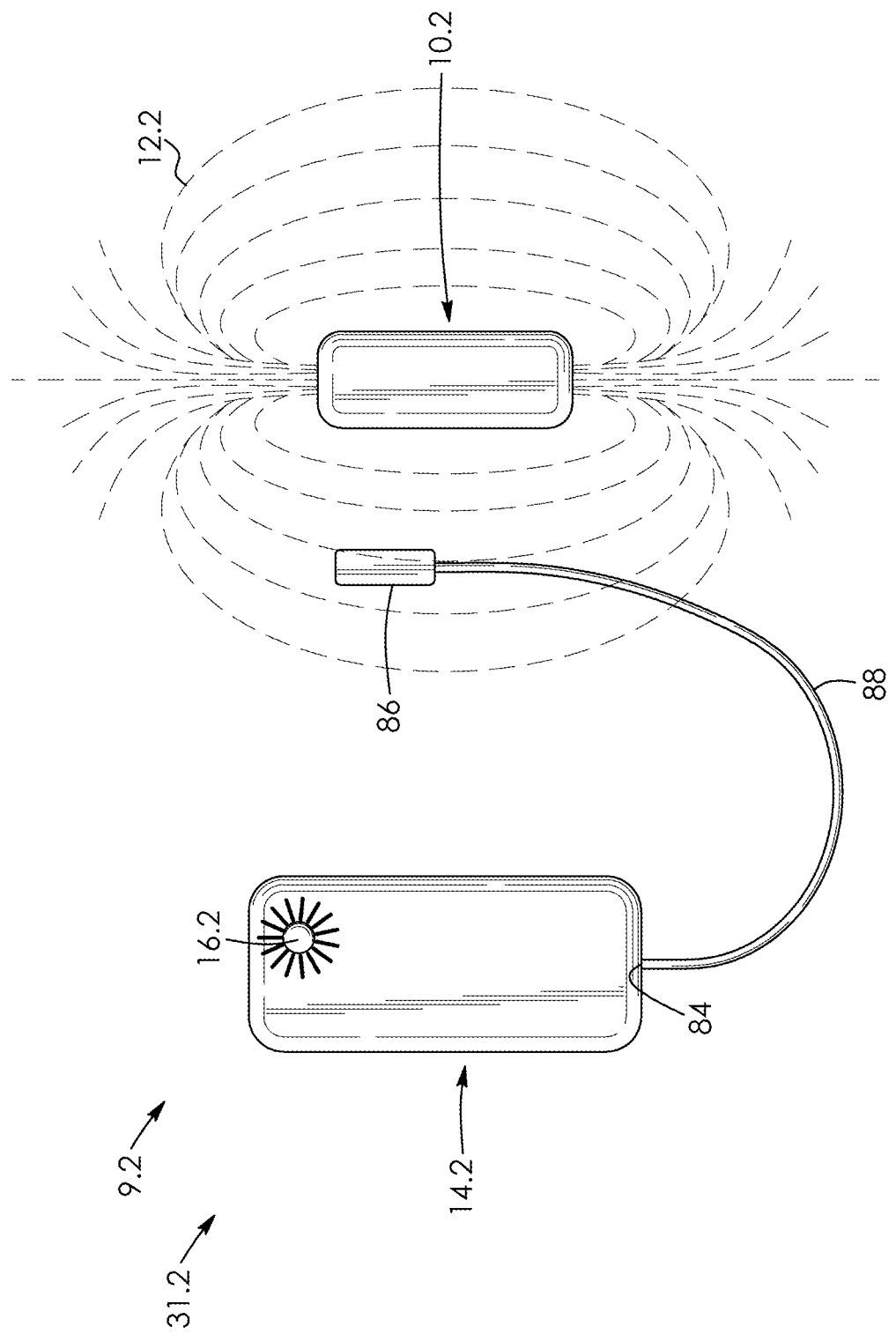
FIG. 22 is a perspective view of a sensor assembly according to a third aspect, the sensor assembly comprising a magnet and a magnetic field sensor.

FIG. 22 shows a sensor assembly 9.2 including a magnet 10.2 and magnetic field sensor 14.2 according to a third aspect. Like parts have like numbers and functions as the sensor assembly 9, magnet 10 and magnetic field sensor 14 shown in FIGS. 1 to 19 with the addition of decimal extension "0.2". Assembly 9.2 is substantially the same as assembly 9 shown in FIGS. 1 to 1.9 with the following exceptions.

Magnetic field sensor 14.2 has a socket 84 for an additional dry contact. This allows another device, such as a reed switch 86, which senses the presence or absence of the magnetic field 12.2 generated by the magnet 10.2, to be coupled to the magnetic field sensor 14.2 by a tether 88. This increases the range of the magnetic field sensor 14.2 as the indicator light 16.2 will turn on when the reed switch 86 is within the magnetic field 1.2.2 even if the magnetic field sensor 14.2 is not within the magnetic field 12.2.

The examples shown in FIGS. 1 to 22 comprise a magnetic field sensor with an indicator in the form of an indicator light. However, it will be understood by a person skilled in the art that, in other examples, the indicator may be an auditory indicator which produces a sound to indicate the presence or absence of a magnetic field, or a vibratory indicator which vibrates to indicate the presence or absence of a magnetic field, or a combination of indicators selected from a visual indicator, an auditory indicator and a vibratory indicator. A switch may be used to select a desired indicator mode.

Figure 23:
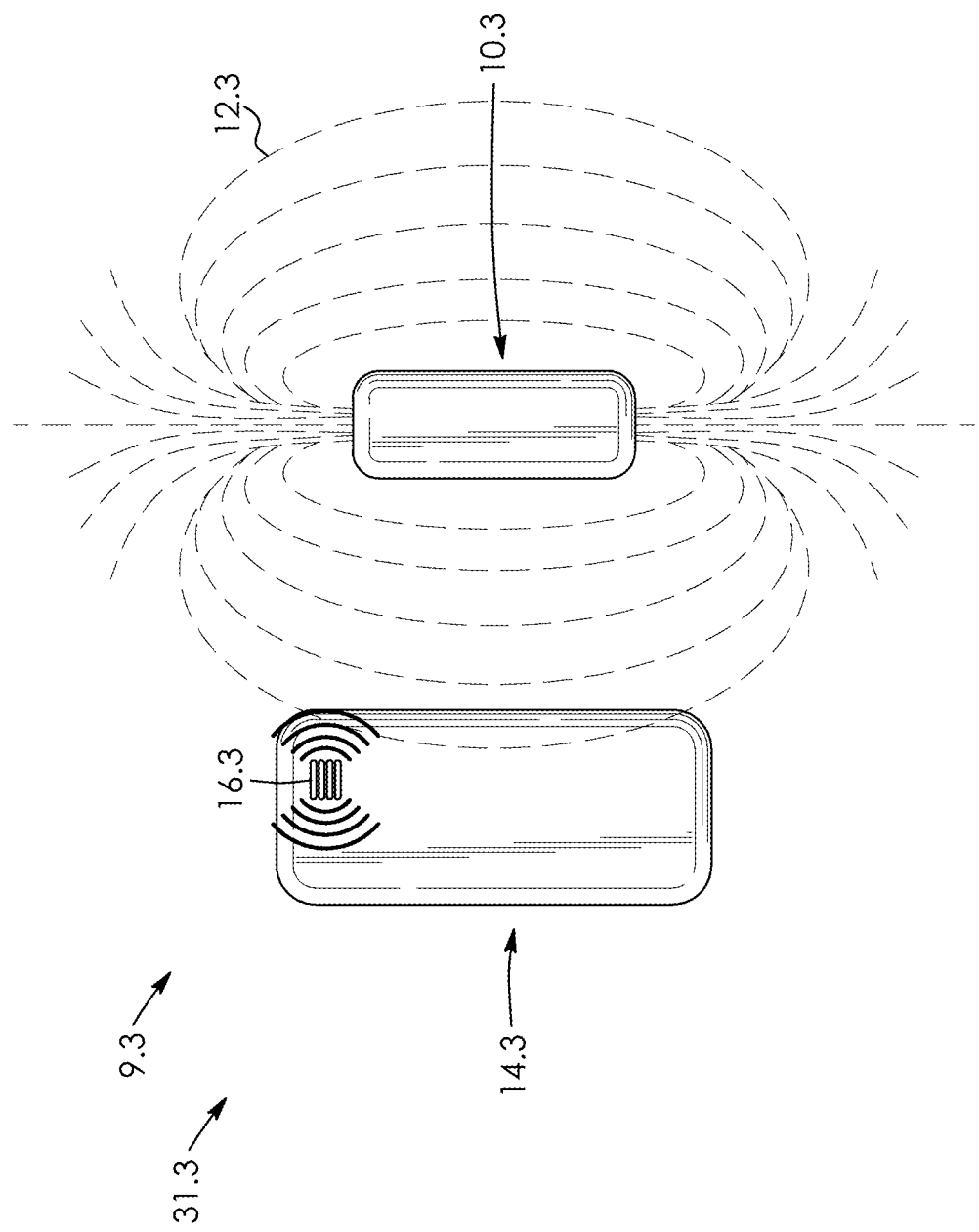
FIG. 23 is a perspective view of a sensor assembly according to a fourth aspect, the sensor assembly comprising a magnet and a magnetic field sensor.

FIG. 23 shows a sensor assembly 9.3 including a magnet 10.3 and magnetic field sensor 14.3 according to a fourth aspect. Like parts have like numbers and functions as the sensor assembly 9, magnet 10 and magnetic field sensor 14 shown in FIGS. 1 to 19 with the addition of decimal extension "0.3". Assembly 9.3 is substantially the same as assembly 9 shown in FIGS. 1 to 19 with the following exceptions.

Magnetic field sensor 14.3 includes an indicator in the form of an auditory indictor 16.3 that provides an auditory indication as to the presence or absence of a magnetic field. The auditory indicator turns on and emits a sound when the magnetic field sensor 14.3 is within the magnetic field 12.3 generated by the magnet 10.3. This provides an auditory indication as to the presence of a magnetic field. However, after a predetermined period of time, the auditory indicator 16.3 will be turned off even in the presence of the magnetic field 12.3. This conserves power and does away with any auditory annoyance when the magnetic field sensor 14.3 is part of a proximity sensor in a security alarm system 31.3.

Figure 24:
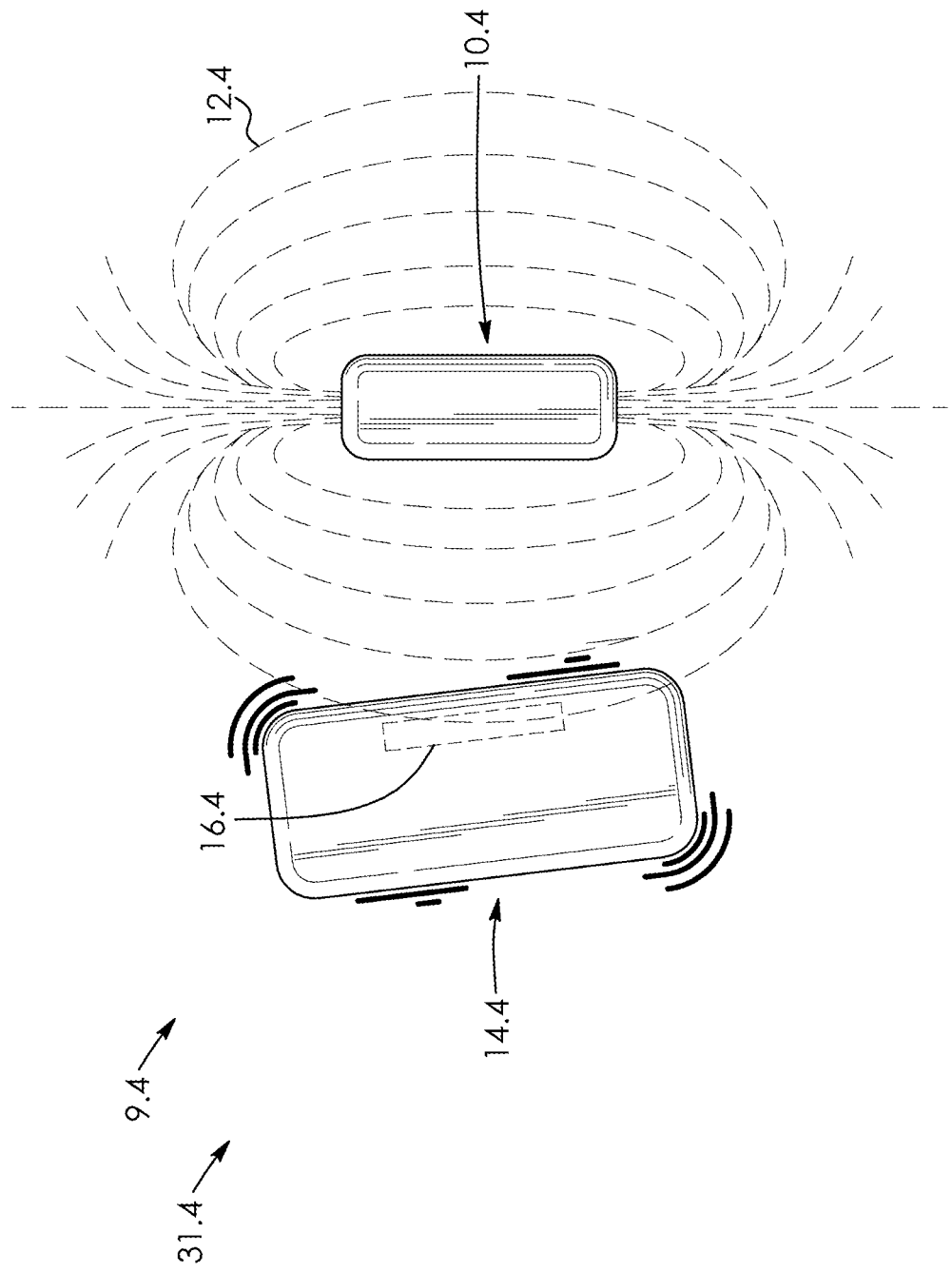
FIG. 24 is a perspective view of a sensor assembly according to a fifth aspect, the sensor assembly comprising a magnet and a magnetic field sensor.

FIG. 24 shows a sensor assembly 9.4 including a magnet 10.4 and magnetic field sensor 14.4 according to a fifth aspect. Like parts have like numbers and functions as the sensor assembly 9, magnet 10 and magnetic field sensor 14 shown in FIGS. 1 to 19 with the addition of decimal extension "0.4". Assembly 9.4 is substantially the same as assembly 9 shown in FIGS. 1 to 19 with the following exceptions.

Magnetic field sensor 14.4 includes an indicator in the form of a vibratory indictor 16.4 that provides a vibratory indication as to the presence or absence of a magnetic field. The vibratory indicator turns on and vibrates when the magnetic field sensor 14.4 is within the magnetic field 12.4 generated by the magnet 10.4. This provides a vibratory indication as to the presence of a magnetic field. However, after a predetermined period of time, the vibratory indicator 16.4 will be turned off even in the presence of the magnetic field 12.4. This conserves power and does away with any vibratory annoyance when the magnetic field sensor 14.4 is part of a proximity sensor in a security alarm system 31.4.

FIGS. 25 to 28 show a sensor assembly 9.5 including a magnet 10.5 and magnetic field sensor 14.5 according to a sixth aspect. Like parts have like numbers and functions as the sensor assembly 9, magnet 10 and magnetic field sensor 14 shown in FIGS. 1 to 19 with the addition of decimal extension "0.5". Assembly 9.5 is substantially the same as assembly 9 shown in FIGS. 1 to 19 with the following exceptions.

Figure 25:
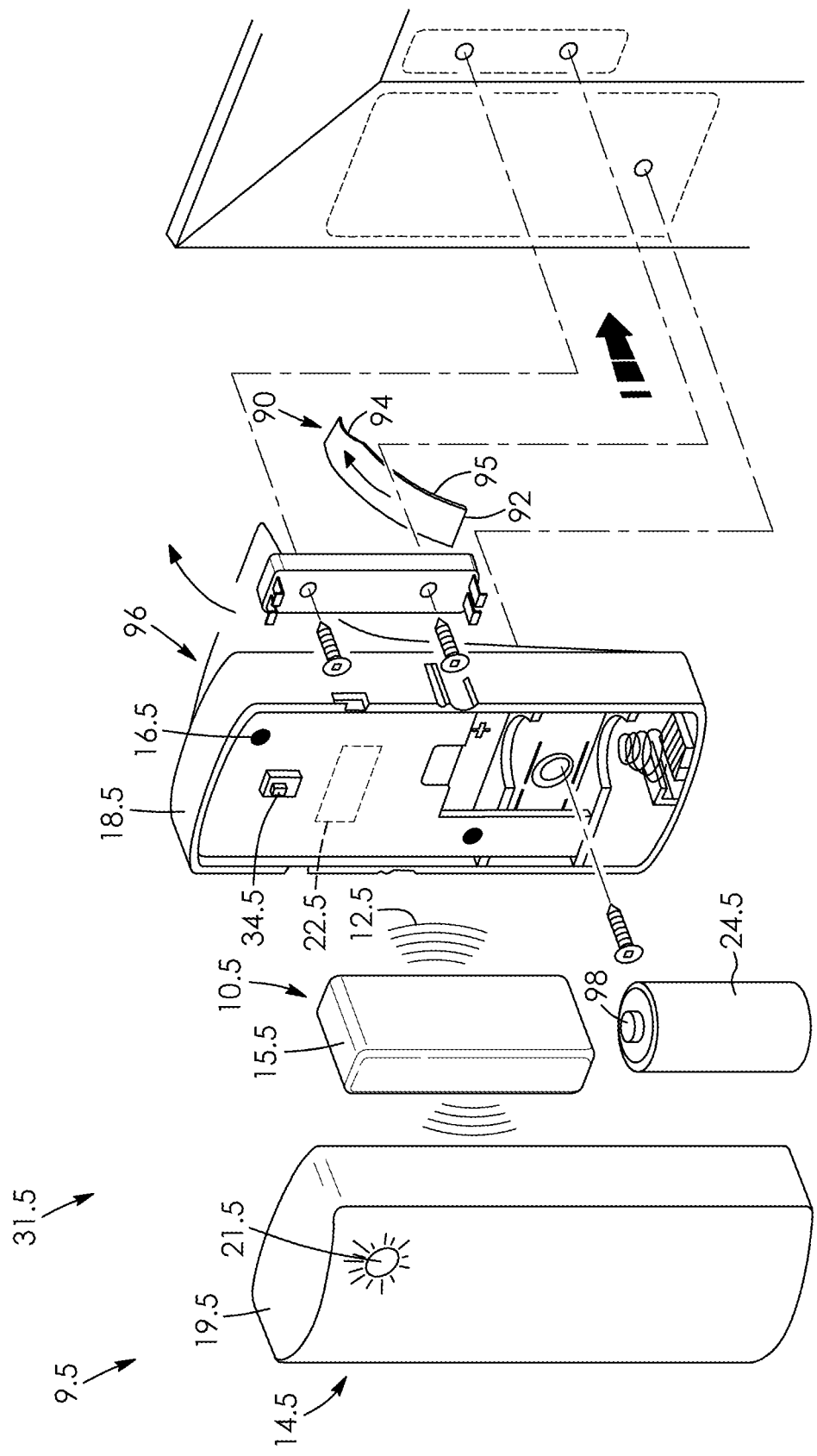
FIG. 25 is a front, right side exploded view of a sensor assembly according to a sixth aspect, the sensor assembly comprising a magnet and a magnetic field sensor, with a door frame and door to which the magnet field sensor and magnet are to be connected also being shown, the door frame and door being shown in fragment.

As seen in FIG. 25, magnetic field sensor 14.5 includes an insulating member, in this example a flexible, planer, insulator strip, in this case a pull strip 90. The pull strip has a proximal end 92 disposed within the housing 18.5 and a distal end 94. The pull strip 90 extends outwards from the rear 96 of the housing in this example, from the distal end thereof towards the proximal end thereof. The proximal end 92 of the pull strip 90 is positioned to inhibit the power source, in this example battery 24.5, from providing power to the rest of the magnetic field sensor 14.5: the pull strip extends between the battery and the rest of the circuitry of the magnified filed sensor and thereby inhibits electrical connection therebetween. In this example the proximal end of the pull strip 90 removably couples to one of the terminals 98 of the battery 24.5 via adhesive 95 seen in FIG. 25.

Figure 26:
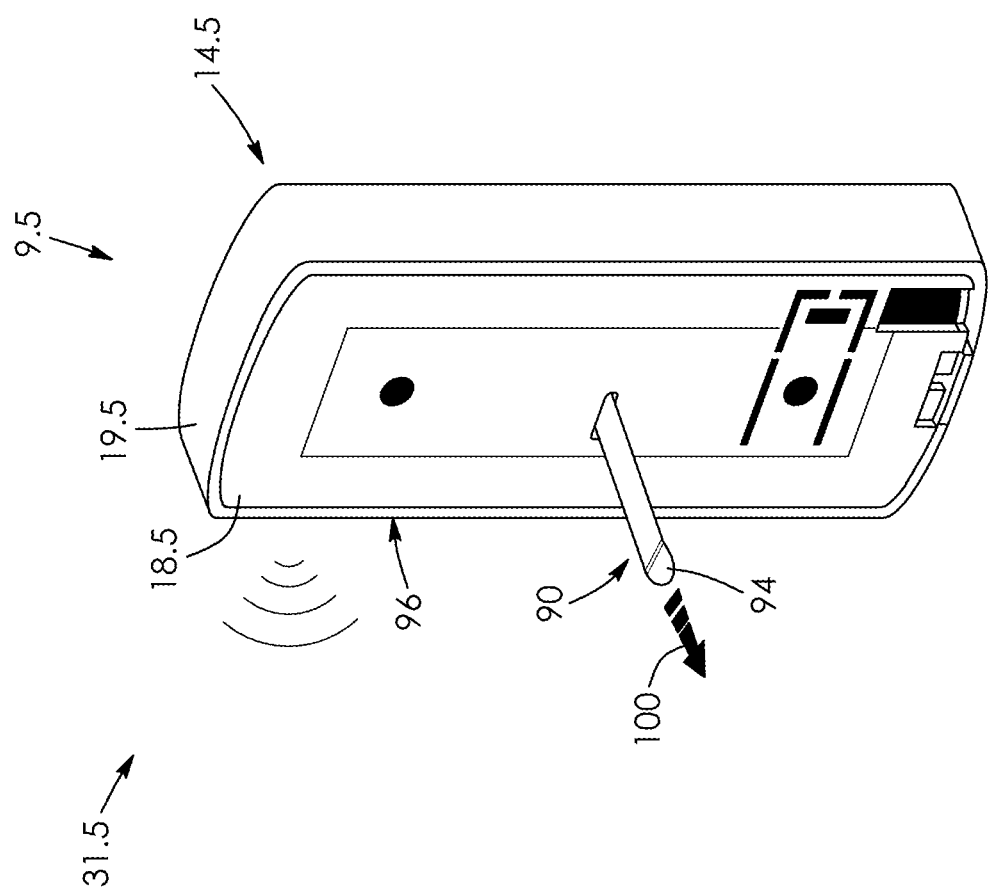
FIG. 26 is a rear, left side perspective view of the magnetic field sensor of FIG. 25, with a pull strip thereof in the process of being removed to enable a power source thereof to power the magnetic field sensor.
Figure 27:
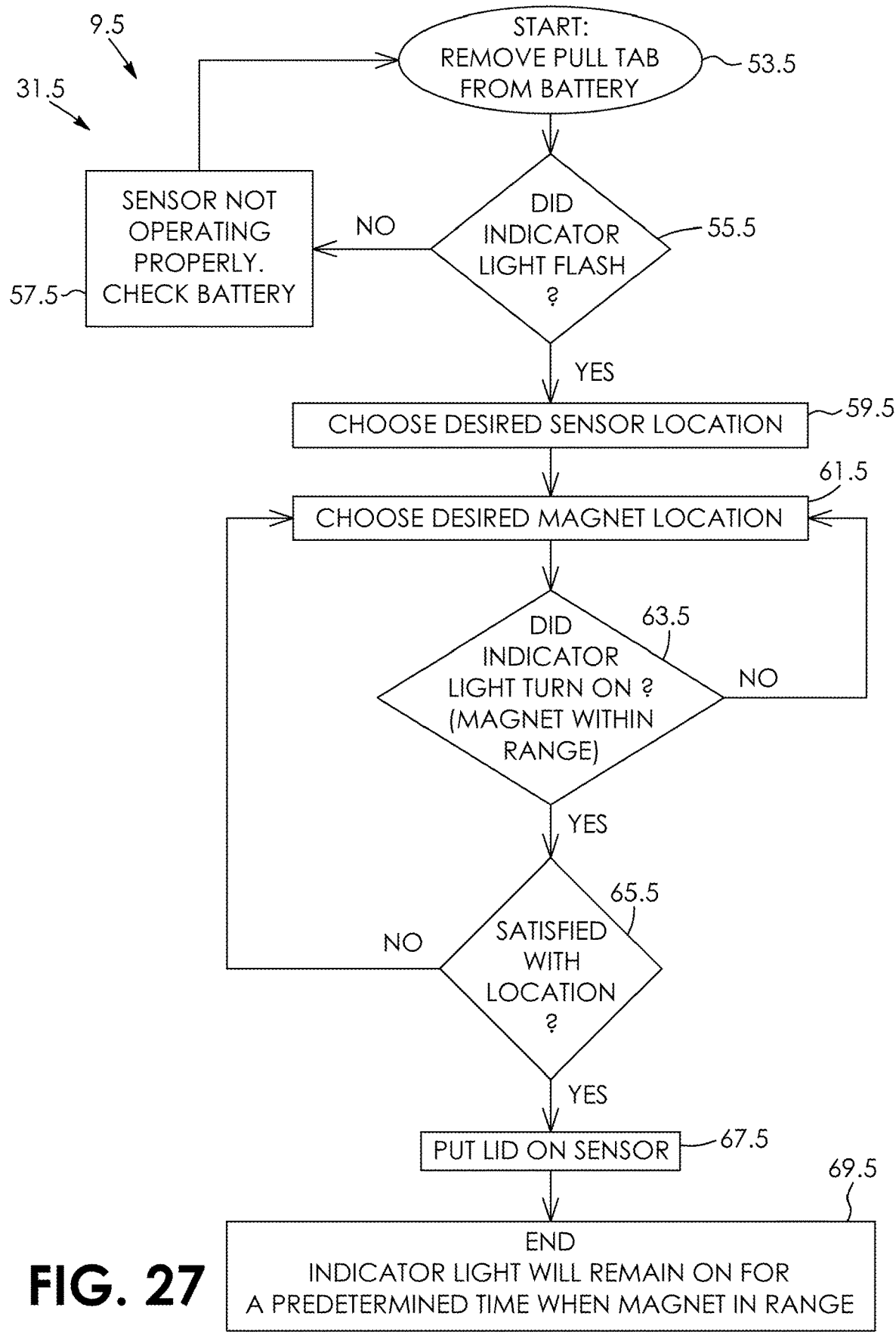
FIG. 27 is a flow chart showing the logic of installing the magnet and the magnetic field sensor of FIG. 25 relative to each other.
Figure 28:
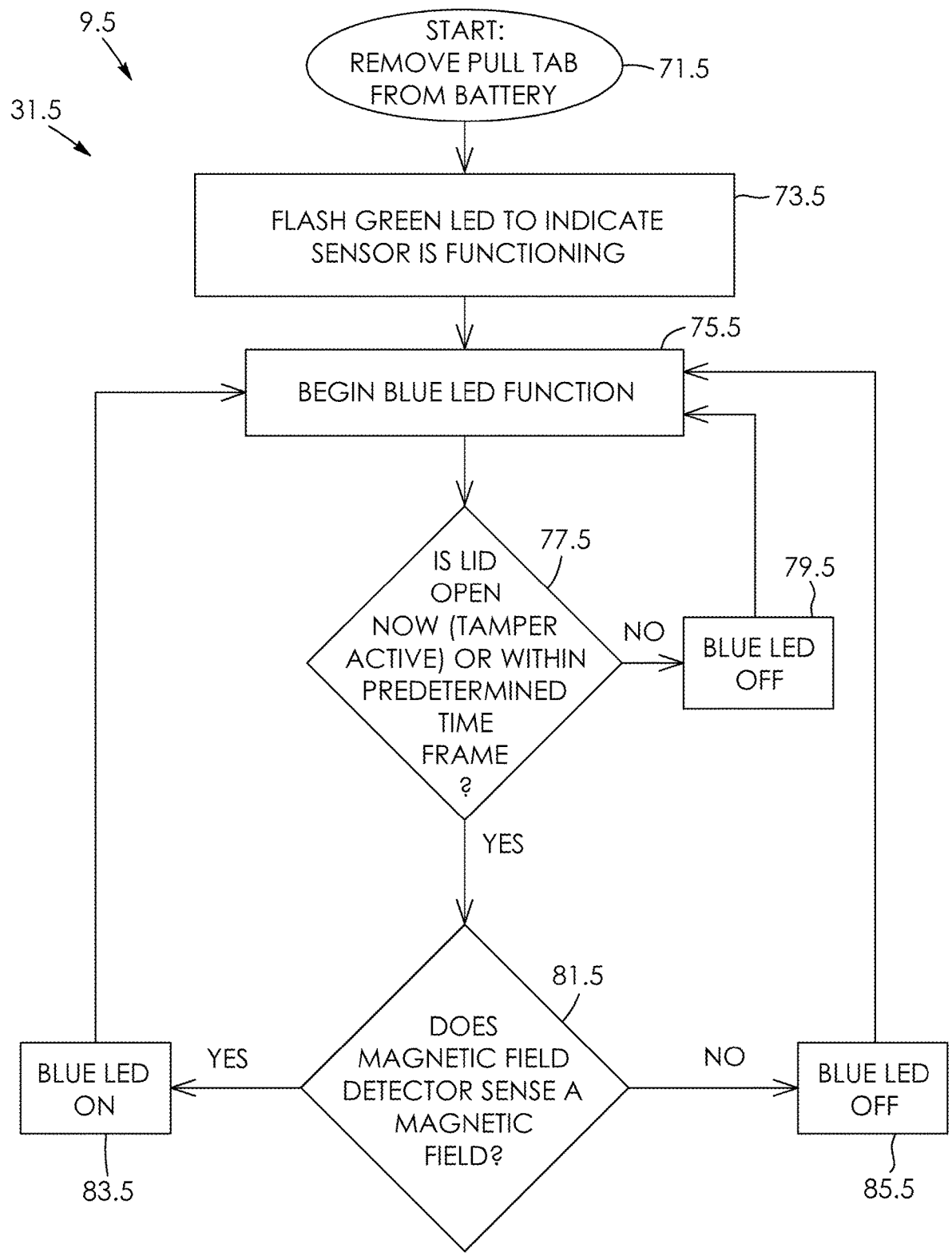
FIG. 28 is a flow chart showing the logic of a software algorithm which drives the magnetic field sensor of FIG. 1.

Referring to FIG. 26, an installer pulling on distal end 94 of the pull strip, as shown by arrow 100, causes the pull strip to be removed and thereby causes the magnetic field sensor 14.5 to be powered up by the battery 24.4 seen in FIG. 25. Still referring to FIG. 25, the indicator 1.6.5 is initially operable following the pull strip 90 being removed from the power source and the magnetic field sensor 14.5 being powered up, and the microprocessor 22.5 renders the indicator inoperable a predetermined period of time after the pull strip has been removed from the power source and the magnetic field sensor is powered up. The indicator remains inoperable until the lid 19.5 of the housing 18.5 is removed and the lid of the housing is closed once more at which point the indicator 16.5 is operable until the microprocessor 22.5 renders the indicator inoperable a predetermined period of time after the lid of the housing is closed.

FIGS. 29 to 32 show a sensor assembly 9.6 according to a seventh aspect. Like parts have like numbers and functions as the sensor assembly 9 shown in FIGS. 1 to 19 with the addition of decimal extension "0.6". Assembly 9.6 is substantially the same as assembly 9 shown in FIGS. 1 to 19 with the following exceptions.

As seen in FIG. 29, sensor assembly 9.6 includes a first subassembly in the form of an RFID tag 10.6 in this example.

Sensor 14.6 includes an RFID reader 101 mounted on circuit board 20.6. Radio 28.6 and antenna 30.6 allow the sensor to communicate with a control panel 102 as part of a wireless security alarm system 31.6. There is a wire 104 in this example which may be electrically and releasably connected to the sensor 14.6. The wire allows the sensor to communicate with the control panel 102 as part of a wired security alarm system. The sensor 14.6 communicates with the control panel to selectively trigger an alarm.

Figure 31:
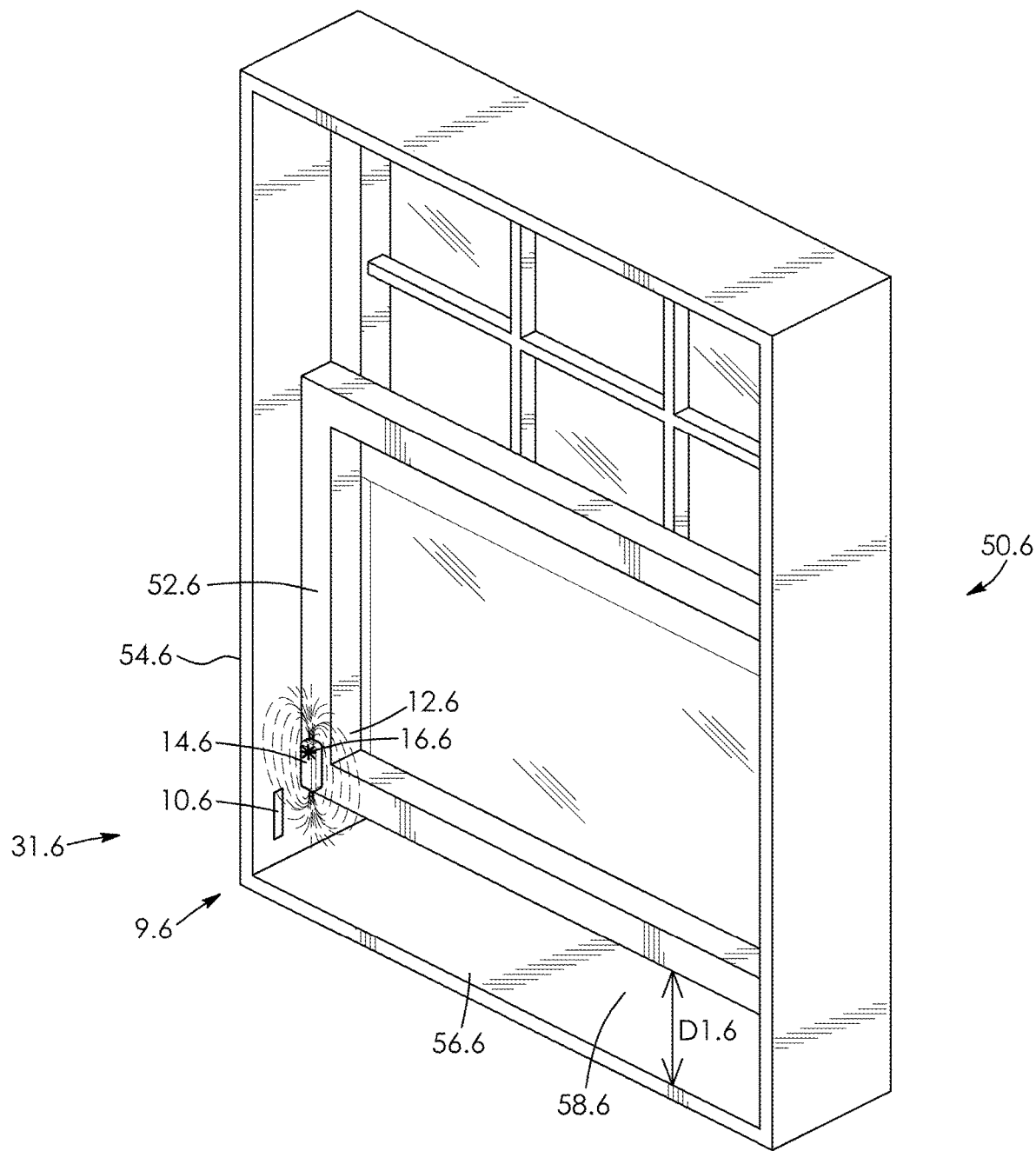
FIG. 31 is a perspective view showing the RFID tag, the sensor and the window of FIG. 30 with the window being open a distance of D1.6.

The RFID tag 10.6 and the sensor 14.6 are used as a window sensor for window 50.6 seen in FIGS. 30 to 32 in this example in a first configuration of security alarm system 31.6; however this is not strictly required and the sensor assembly 9.6 may be used in other manners in other examples. In a wireless security alarm system 31.6 configuration the sensor 14.6 is mounted on stile 52.6 of window 50.6 and RFID tag 10.6 is mounted on side jamb 54.6 of the window near sill 56.6 thereof. In a wired configuration the RFID tag is mounted on the stile of window and the sensor is mounted on the side jamb of the window near sill thereof.

Referring to FIG. 30, the window is fully closed with bottom rail 58.6 of the window abutting the sill thereof. The sensor 14.6 seen in FIG. 29 is configured to read the RFID tag 10.6 when the window 50.6 is fully closed, and signals that the window 50.6 is closed. A signal is thus sent by the RFID reader 101 to the microprocessor 22.6 when the RFID reader is in communication range with the RFID tag in one example. Indicator 16.6 indicates when data from the RFID tag 10.6 has been transmitted to the RFID reader 101 in response to the RFID tag being triggered by electromagnetic interrogation from the RFID reader. The indicator thus indicates when the RFID reader 101 in communication range with the RFID tag 10.6 and data from the RFID tag is received by the RFID reader, and turns off when the RFID tag is not detected and not in communication range in one example.

In addition or alternatively and still referring to FIG. 29, the microprocessor is configured to analyze changes in signals from the RFID tag to determine when a distance between the RFID tag and the RFID reader is within a predetermined threshold. This may be determined by the microprocessor 22.6 analyzing and comparing changes in time and amplitude characteristics of the signals, for example. In this case the indicator 16.6 indicates when the distance between the RFID tag 10.6 and the RFID reader 101 is within a predetermined threshold. In this case the indicator turns on when the distance between the RFID tag and the RFID reader is within said predetermined threshold and turns off when the distance between the RFID tag and the RFID reader is outside of said predetermined threshold.

Likewise, as shown in FIG. 31, the sensor 14.6 is also able to read the RFID tag 10.6 when the window 50.6 is open up to a threshold distance D1.6. It is desirable to allow the window 50.6 to be partially opened for ventilation but not opened enough to allow an intruder to enter through the window 50.6. The sensor 14.6 will accordingly not trigger an alarm when the sensor 14.6 is able to read the RFID tag 10.6.

However, and with reference to FIG. 32, when the window 50.6 is open to a distance D2.6, which is greater than the threshold distance D1.6, the sensor 14.6 is no longer able to read the RFID tag 10.6 and/or the microprocessor determines that the RFID tag is at a distance greater than the threshold distance, and an alarm is triggered. The sensor may be mounted on bottom rail 58.6 of the window in other configurations, for example.

FIG. 33 shows a sensor assembly 9.7 according to an eighth aspect. The sensor assembly is substantially similar to the sensor assembly 9.6 of FIGS. 29 to 32, with like parts having like numbers and functions with decimal extension "0.7" replacing "0.6" and decimal extension "0.7" being added for numbers not previously having decimal extensions, with the following exception. Sensor assembly 9.7 includes a pull strip 90.7 to selectively enable a power source thereof to power the sensor 14.7 thereof in a manner substantially similar to that described for sensor assembly 9.5 seen in FIGS. 25 to 28.

It will be understood by a person skilled in the art that many of the details provided above are by way of example only, and are not intended to limit the scope of the invention which is to be determined with reference to the following claims.

What is claimed is:

1. A magnetic field sensor comprising:
   a housing having a lid;
   a tamper switch which detects when the lid of the housing is opened;
   a device which senses a presence or an absence of a magnetic field;
   a power source disposed within the housing;
   a pull strip positioned to inhibit the power source from providing power to the magnetic field sensor, with the magnetic field sensor being powered up when the pull strip is removed;
   a microprocessor, a signal being sent by the tamper switch to the microprocessor when the lid of the housing is open, and a signal being sent by the device to the microprocessor when a magnetic field is sensed; and
   at least one indicator which indicates the presence or the absence of a magnetic field, wherein the at least one indicator turns on when a magnetic field is sensed and turns off when a magnetic field is not sensed;
   wherein the at least one indicator is initially operable following the pull strip being removed and the magnetic field sensor being powered up, and the microprocessor renders the at least one indicator inoperable a predetermined period of time after the pull strip is removed and the magnetic field sensor is powered up, the at least one indicator remaining inoperable until the lid of the housing is removed and the lid of the housing is next closed at which point the at least one indicator is operable until the microprocessor renders the at least one indicator inoperable a further said predetermined period of time after the lid of the housing is closed.

2. The magnetic field sensor as claimed in claim 1, wherein the at least one indicator is one or more of a visual said indicator, an auditory said indicator or a vibratory said indicator.

3. The magnetic field sensor as claimed in claim 1, wherein the at least one indicator comprises a light emitting diode.

4. The magnetic field sensor as claimed in claim 1 including a supercapacitor.

5. The magnetic field sensor as claimed in claim 1 including a radio and an antenna.

6. The magnetic field sensor as claimed in claim 1, wherein the pull strip is an insulator.

7. The magnetic field sensor as claimed in claim 1, wherein the pull strip removably couples to the power source via adhesive.

8. The magnetic field sensor as claimed in claim 1, wherein said device is a magnetoresistive sensor or a Hall Effect sensor.

9. The magnetic field sensor as claimed in claim 1, wherein the power source is a coin cell battery.

10. The magnetic field sensor as claimed in claim 1, wherein the magnetic field sensor is a parallelepiped in shape.

11. A proximity sensor comprising a magnet and the magnetic field sensor as claimed in claim 1.

12. A security alarm system including the proximity sensor as claimed in claim 11.

13. A magnetic field sensor comprising:
a housing having a lid;
a tamper switch which detects when the lid of the housing is opened;
a device which senses a presence or an absence of a magnetic field;
a power source;
a pull strip positioned to inhibit the power source from providing power to the magnetic field sensor, with the magnetic field sensor being powered up when the pull strip is removed;
a microprocessor, a signal being sent by the tamper switch to the microprocessor when the lid of the housing is removed, and a signal being sent by the device to the microprocessor when a magnetic field is sensed; and
at least one indicator which indicates the presence or the absence of a magnetic field, wherein the at least one indicator turns on when a magnetic field is sensed and turns off when a magnetic field is not sensed;
wherein the at least one indicator turns on following the pull strip being removed and when a magnetic field is sensed, the at least one indicator remaining on for a predetermined period of time while the magnetic field is sensed and the lid of the housing is closed, and the at least one indicator then being turned off, even if a magnetic field is sensed, until the lid of the housing is removed to restart an algorithm based on the signal sent by the tamper switch to the microprocessor when the lid of the housing is removed, the algorithm relating to the sensing of a magnetic field.

14. The magnetic field sensor as claimed in claim 13, wherein the pull strip is an insulator.

15. The magnetic field sensor as claimed in claim 13, wherein said device is a magnetoresistive sensor or a Hall Effect sensor.

16. The magnetic field sensor as claimed in claim 13, wherein the power source is a coin cell battery.

17. A magnetic field sensor comprising:
a housing including a lid and a tamper switch which detects when the lid thereof is removed;
a device which senses a presence or an absence of a magnetic field;
a microprocessor, a signal being sent by the tamper switch to the microprocessor when the lid of the housing is removed, and a signal being sent by the device to the microprocessor when a magnetic field is sensed; and
at least one indicator which indicates the presence or the absence of a magnetic field, the at least one indicator turning on upon both being powered up and a magnetic field being sensed, the at least one indicator remaining on for a predetermined period of time while the magnetic field is sensed and the lid of the housing is closed, and the at least one indicator then being turned off, even if a magnetic field is sensed, until the lid of the housing is removed to restart an algorithm based on the signal sent by the tamper switch to the microprocessor when the lid of the housing is removed, the algorithm relating to the sensing of a magnetic field.

18. The magnetic field sensor as claimed in claim 1, wherein the magnetic field sensor comprises two or more said indicators.

19. The magnetic field sensor as claimed in claim 1, wherein the magnetic field sensor comprises a first said indicator which provides an indication of the presence or absence of the magnetic field and wherein the magnetic field sensor comprises a second said indicator which provides an indication as to the strength of the magnetic field.

20. The magnetic field sensor as claimed in claim 1, wherein one or more of: the magnetic field sensor is powered up when the pull strip is removed from the power source; and the power source selectively supplies current to the at least one indicator.

* * * * *